(12) United States Patent
Zhao et al.

(10) Patent No.: US 7,241,645 B2
(45) Date of Patent: Jul. 10, 2007

(54) METHOD FOR ASSEMBLING A BALL GRID ARRAY PACKAGE WITH MULTIPLE INTERPOSERS

(75) Inventors: Sam Ziqun Zhao, Irvine, CA (US); Reza-ur Rahman Khan, Rancho Santa Margarita, CA (US)

(73) Assignee: Broadcom Corporation, Irvine, CA (US)

( * ) Notice: Subject to any disclaimer, the term of this patent is extended or adjusted under 35 U.S.C. 154(b) by 294 days.

(21) Appl. No.: 10/932,278

(22) Filed: Sep. 2, 2004

(65) Prior Publication Data

US 2005/0023677 A1 Feb. 3, 2005

Related U.S. Application Data

(63) Continuation of application No. 10/284,166, filed on Oct. 31, 2002, now Pat. No. 6,861,750.

(60) Provisional application No. 60/352,877, filed on Feb. 1, 2002.

(51) Int. Cl.
| H01L 21/50 | (2006.01) |
| H01L 21/48 | (2006.01) |
| H01L 21/44 | (2006.01) |
| H01L 23/10 | (2006.01) |
| H01L 23/34 | (2006.01) |
| H01L 23/498 | (2006.01) |

(52) U.S. Cl. ............ 438/122; 438/106; 438/121; 257/707; 257/706; 257/719; 257/720; 257/E23.069; 257/E23.066

(58) Field of Classification Search ........ 438/121–122, 438/106; 257/706–707, 718–720
See application file for complete search history.

(56) References Cited

U.S. PATENT DOCUMENTS 3,790,866 A 2/1974 Meyer et al.

(Continued)

FOREIGN PATENT DOCUMENTS

EP 0 573 297 A2 12/1993

(Continued)

OTHER PUBLICATIONS

Ahn, S.H. and Kwon, Y.S., "Popcorn Phenomena in a Ball Grid Array Package", *IEEE Transactions on Components, Packaging, and Manufacturing Technology Part B: Advanced Packaging*, IEEE, Aug. 1995, vol. 18, No. 3, pp. 491-495.

(Continued)

*Primary Examiner*—Luan Thai
(74) *Attorney, Agent, or Firm*—Sterne, Kessler, Goldstein & Fox P.L.L.C.

(57) ABSTRACT

Electrically, thermally and mechanically enhanced ball grid array (BGA) packages are described. An IC die is mounted to a first surface of a first stiffener. A peripheral edge portion of a second surface of the first stiffener is attached to a first surface of a second stiffener to cover an opening through the second stiffener that is open at the first surface and a second surface of the second stiffener. The second surface of the second stiffener is attached to a first surface of a substantially planar substrate that has a plurality of contact pads on the first surface of the substrate. The plurality of contact pads are electrically connected through the substrate to a plurality of solder ball pads on a second surface of the substrate.

20 Claims, 21 Drawing Sheets

U.S. PATENT DOCUMENTS

| | | |
|---|---|---|
| 4,611,238 A | 9/1986 | Lewis et al. |
| 5,045,921 A | 9/1991 | Lin et al. |
| 5,065,281 A | 11/1991 | Hernandez et al. |
| 5,173,766 A | 12/1992 | Long et al. |
| 5,208,504 A | 5/1993 | Parker et al. |
| 5,216,278 A | 6/1993 | Lin et al. |
| 5,285,352 A | 2/1994 | Pastore et al. |
| 5,291,062 A | 3/1994 | Higgins, III |
| 5,294,826 A | 3/1994 | Marcantonio et al. |
| 5,366,589 A | 11/1994 | Chang |
| 5,394,009 A | 2/1995 | Loo |
| 5,397,917 A | 3/1995 | Ommen et al. |
| 5,397,921 A | 3/1995 | Karnezos |
| 5,409,865 A | 4/1995 | Karnezos |
| 5,433,631 A | 7/1995 | Beaman et al. |
| 5,438,216 A | 8/1995 | Juskey et al. |
| 5,474,957 A | 12/1995 | Urushima |
| 5,490,324 A | 2/1996 | Newman |
| 5,534,467 A | 7/1996 | Rostoker |
| 5,541,450 A | 7/1996 | Jones et al. |
| 5,552,635 A | 9/1996 | Kim et al. |
| 5,572,405 A | 11/1996 | Wilson et al. |
| 5,578,869 A | 11/1996 | Hoffman et al. |
| 5,583,377 A | 12/1996 | Higgins, III |
| 5,583,378 A | 12/1996 | Marrs et al. |
| 5,642,261 A | 6/1997 | Bond et al. |
| 5,648,679 A | 7/1997 | Chillara et al. |
| 5,650,659 A | 7/1997 | Mostafazadeh et al. |
| 5,650,662 A | 7/1997 | Edwards et al. |
| 5,691,567 A | 11/1997 | Lo et al. |
| 5,717,252 A | 2/1998 | Nakashima et al. |
| 5,736,785 A | 4/1998 | Chiang et al. |
| 5,744,863 A | 4/1998 | Culnane et al. |
| 5,796,170 A | 8/1998 | Marcantonio |
| 5,798,909 A | 8/1998 | Bhatt et al. |
| 5,801,432 A | 9/1998 | Rostoker et al. |
| 5,835,355 A | 11/1998 | Dordi |
| 5,843,808 A | 12/1998 | Karnezos |
| 5,844,168 A | 12/1998 | Schueller et al. |
| 5,856,911 A | 1/1999 | Riley |
| 5,866,949 A | 2/1999 | Schueller |
| 5,883,430 A | 3/1999 | Johnson |
| 5,889,321 A | 3/1999 | Culnane et al. |
| 5,889,324 A | 3/1999 | Suzuki |
| 5,894,410 A | 4/1999 | Barrow |
| 5,895,967 A | 4/1999 | Stearns et al. |
| 5,901,041 A | 5/1999 | Davies et al. |
| 5,903,052 A | 5/1999 | Chen et al. |
| 5,905,633 A | 5/1999 | Shim et al. |
| 5,907,189 A | 5/1999 | Mertol |
| 5,907,903 A | 6/1999 | Ameen et al. |
| 5,920,117 A | 7/1999 | Sono et al. |
| 5,949,137 A | 9/1999 | Domadia et al. |
| 5,953,589 A | 9/1999 | Shim et al. |
| 5,972,734 A | 10/1999 | Carichner et al. |
| 5,976,912 A | 11/1999 | Fukutomi et al. |
| 5,977,626 A | 11/1999 | Wang et al. |
| 5,977,633 A | 11/1999 | Suzuki et al. |
| 5,982,621 A | 11/1999 | Li |
| 5,986,340 A | 11/1999 | Mostafazadeh et al. |
| 5,986,885 A | 11/1999 | Wyland |
| 5,998,241 A | 12/1999 | Niwa |
| 5,999,415 A | 12/1999 | Hamzehdoost |
| 6,002,147 A | 12/1999 | Iovdalsky et al. |
| 6,002,169 A | 12/1999 | Chia et al. |
| 6,011,304 A | 1/2000 | Mertol |
| 6,011,694 A | 1/2000 | Hirakawa |
| 6,020,637 A | 2/2000 | Karnezos |
| 6,028,358 A | 2/2000 | Suzuki |
| 6,034,427 A | 3/2000 | Lan et al. |
| 6,040,984 A | 3/2000 | Hirakawa |
| 6,057,601 A | 5/2000 | Lau et al. |
| 6,060,777 A | 5/2000 | Jamieson et al. |
| 6,064,111 A | 5/2000 | Sota et al. |
| 6,069,407 A | 5/2000 | Hamzehdoost |
| 6,077,724 A | 6/2000 | Chen |
| 6,084,297 A | 7/2000 | Brooks et al. |
| 6,084,777 A | 7/2000 | Kalidas et al. |
| 6,114,761 A | 9/2000 | Mertol et al. |
| 6,117,797 A | 9/2000 | Hembree |
| 6,122,171 A | 9/2000 | Akram et al. |
| 6,133,064 A | 10/2000 | Nagarajan et al. |
| 6,140,707 A | 10/2000 | Plepys et al. |
| 6,160,705 A | 12/2000 | Stearns et al. |
| 6,162,659 A | 12/2000 | Wu |
| 6,163,458 A | 12/2000 | Li |
| 6,166,434 A | 12/2000 | Desai et al. |
| 6,184,580 B1 | 2/2001 | Lin |
| 6,201,300 B1 | 3/2001 | Tseng et al. |
| 6,207,467 B1 | 3/2001 | Vaiyapuri et al. |
| 6,212,070 B1 | 4/2001 | Atwood et al. |
| 6,242,279 B1 | 6/2001 | Ho et al. |
| 6,246,111 B1 | 6/2001 | Huang et al. |
| 6,278,613 B1 | 8/2001 | Fernandez et al. |
| 6,288,444 B1 | 9/2001 | Abe et al. |
| 6,313,521 B1 | 11/2001 | Baba |
| 6,313,525 B1 | 11/2001 | Sasano |
| 6,347,037 B2 | 2/2002 | Iijima et al. |
| 6,362,525 B1 | 3/2002 | Rahim |
| 6,365,980 B1 | 4/2002 | Carter, Jr. et al. |
| 6,369,455 B1 | 4/2002 | Ho et al. |
| 6,380,623 B1 | 4/2002 | Demore |
| 6,462,274 B1 | 10/2002 | Shim et al. |
| 6,472,741 B1 | 10/2002 | Chen et al. |
| 6,525,942 B2 | 2/2003 | Huang et al. |
| 6,528,869 B1 | 3/2003 | Glenn et al. |
| 6,528,892 B2 | 3/2003 | Caletka et al. |
| 6,541,832 B2 | 4/2003 | Coyle |
| 6,545,351 B1 | 4/2003 | Jamieson et al. |
| 6,552,266 B2 | 4/2003 | Carden et al. |
| 6,552,428 B1 | 4/2003 | Huang et al. |
| 6,552,430 B1 | 4/2003 | Perez et al. |
| 6,563,712 B2 | 5/2003 | Akram et al. |
| 6,583,516 B2 | 6/2003 | Hashimoto |
| 6,602,732 B2 | 8/2003 | Chen |
| 6,614,660 B1 | 9/2003 | Bai et al. |
| 6,617,193 B1 | 9/2003 | Toshio et al. |
| 6,657,870 B1 | 12/2003 | Ali et al. |
| 6,664,617 B2 | 12/2003 | Siu |
| 6,724,071 B2 | 4/2004 | Combs |
| 6,724,080 B1 | 4/2004 | Ooi et al. |
| 6,797,890 B2 * | 9/2004 | Okubora et al. ............ 174/260 |
| 2001/0001505 A1 | 5/2001 | Schueller et al. |
| 2001/0040279 A1 | 11/2001 | Mess et al. |
| 2001/0045644 A1 | 11/2001 | Huang |
| 2002/0053731 A1 | 5/2002 | Chao et al. |
| 2002/0072214 A1 | 6/2002 | Yuzawa et al. |
| 2002/0079562 A1 | 6/2002 | Zhao et al. |
| 2002/0079572 A1 | 6/2002 | Khan et al. |
| 2002/0096767 A1 | 7/2002 | Cote et al. |
| 2002/0098617 A1 | 7/2002 | Lee et al. |
| 2002/0109226 A1 | 8/2002 | Khan et al. |
| 2002/0135065 A1 | 9/2002 | Zhao et al. |
| 2002/0171144 A1 | 11/2002 | Zhang et al. |
| 2002/0180040 A1 | 12/2002 | Camenforte et al. |
| 2002/0185717 A1 | 12/2002 | Eghan et al. |
| 2002/0185720 A1 | 12/2002 | Khan et al. |
| 2002/0185722 A1 | 12/2002 | Zhao et al. |
| 2002/0185734 A1 | 12/2002 | Zhao et al. |
| 2002/0185750 A1 | 12/2002 | Khan et al. |
| 2002/0190361 A1 | 12/2002 | Zhao et al. |
| 2002/0190362 A1 | 12/2002 | Khan et al. |
| 2003/0057550 A1 | 3/2003 | Zhao et al. |
| 2003/0111726 A1 | 6/2003 | Khan et al. |

| | | | |
|---|---|---|---|
| 2003/0138613 | A1 | 7/2003 | Thoman et al. |
| 2003/0146503 | A1 | 8/2003 | Khan et al. |
| 2003/0146506 | A1 | 8/2003 | Khan et al. |
| 2003/0146509 | A1 | 8/2003 | Zhao et al. |
| 2003/0146511 | A1 | 8/2003 | Zhao et al. |
| 2003/0179549 | A1 | 9/2003 | Zhong et al. |
| 2003/0179556 | A1 | 9/2003 | Zhao et al. |
| 2004/0072456 | A1 | 4/2004 | Dozier, II et al. |
| 2004/0113284 | A1 | 6/2004 | Zhao et al. |

FOREIGN PATENT DOCUMENTS

| | | |
|---|---|---|
| EP | 0 504 411 B1 | 6/1998 |
| FR | 2 803 098 A3 | 6/2001 |
| JP | 61-49446 A | 3/1986 |
| JP | 7-283336 A | 10/1995 |
| JP | 10-50877 A | 2/1998 |
| JP | 10-189835 A | 7/1998 |
| JP | 10-247702 A | 9/1998 |
| JP | 10-247703 A | 9/1998 |
| JP | 11-17064 A | 1/1999 |
| JP | 11-102989 A | 4/1999 |
| JP | 2000-286294 A | 10/2000 |
| JP | 2001-68512 A | 3/2001 |
| TW | 383908 | 3/2000 |
| TW | 417219 | 1/2001 |

OTHER PUBLICATIONS

Amkor Electronics, "Amkor BGA Packaging: Taking The World By Storm", *Electronic Packaging & Production*, Cahners Publishing Company, May 1994, page unknown.

Anderson, L. and Trabucco, B., "Solder Attachment Analysis of Plastic BGA Modules", *Surface Mount International Conference*, Surface Mount International, Aug. 28-Sep. 1, 1994, San Jose, California, pp. 189-194.

Andrews, M., "Trends in Ball Grid Array Technology," *Ball Grid Array National Symposium*, Mar. 29-30, 1995, Dallas, Texas, 10 pages.

Attarwala, A.I. Dr. and Stierman, R., "Failure Mode Analysis of a 540 Pin Plastic Ball Grid Array", *Surface Mount International Conference*, Surface Mount International, Aug. 28-Sep. 1, 1994, San Jose, California, pp. 252-257.

Banerji, K., "Development of the Slightly Larger Than IC Carrier (SLICC)", *Journal of Surface Mount Technology*, Jul. 1994, pp. 21-26.

Bauer, C., Ph.D., "Partitioning and Die Selection Strategies for Cost Effective MCM Designs", *Journal of Surface Mount Technology*, Oct. 1994, pp. 4-9.

Bernier, W.E. et al., "BGA vs. QFP: A Summary of Tradeoffs for Selection of High I/O Components", *Surface Mount International Conference Proceedings*, Surface Mount International, Aug. 28-Sep. 1, 1994, San Jose, California, pp. 181-185.

Burgos, J. et al., "Achieving Accurate Thermal Characterization Using a CFD Code—A Case Study of Plastic Packages",*IEEE Transactions on Components, Packaging, and Manufacturing Technology Part A*, IEEE, Dec. 1995, vol. 18, No. 4, pp. 732-738.

Chadima, M., "Interconnecting Structure Manufacturing Technology," *Ball Grid Array National Symposium*, Dallas, Texas, Mar. 29-30, 1995, 12 pages.

Chanchani, R. et al., "Mini BGA: Pad and Pitch Ease Die Test and Handling", *Advanced Packaging*, IHS Publishing Group, May/Jun. 1995, pp. 34 and 36-37.

Chung, T.C. et al., "Rework of Plastic, Ceramic, and Tape Ball Grid Array Assemblies", *Ball Grid Array National Symposium Proceedings*, Dallas, Texas, Mar. 29-30, 1995, pp. 1-15.

Cole, M.S. and Caulfield, T. "A Review of Available Bell Grid Array (BGA) Packages", *Journal of Surface Mount Technology*, Surface Mount Technology Association, Jan. 1996, vol. 9, pp. 4-11.

Cole, M.S. and Caulfield, T., "Ball Grid Array Packaging", *Surface Mount International Conference Proceedings*, Surface Mount International, Aug. 28-Sep. 1, 1994, San Jose, California, pp. 147-153.

Dobers, M. and Seyffert, M., "Low Cost MCMs: BGAs Provide a Fine-Pitch Alternative", *Advanced Packaging*, IHS Publishing Group, Sep./Oct. 1994, vol. 3, No. 5, pp. 28, 30 and 32.

Dody, G. and Burnette, T., "BGA Assembly Process and Rework", *Journal of Surface Mount Technology*, Surface Mount Technology Association, Jan. 1996, vol. 9, pp. 39-45.

Edwards, D. et al., "The Effect of Internal Package Delaminations on the Thermal Performance of PQFP, Thermally Enhanced PQFP, LOC and BGA Packages", *45th Electronic Components & Technology Conference*, IEEE, May 21-24, 1995, Las Vegas, NV, pp. 285-292.

Ejim, T.L. et al., "Designed Experiment to Determine Attachment Reliability Drivers for PBGA Packages", *Journal of Surface Mount Technology*, Surface Mount Technology Association, Jan. 1996, vol. 9, pp. 30-38.

English-language Abstract of JP 10-189835, published Jul. 21, 1998, 1 page, printed from http://v3.espacenet.com.

English-language Translation of JP 10-247702, published Sep. 14, 1998, 8 pages.

English-language Abstract of JP 10-247703, published Sep. 14, 1998, 1 page, printed from http://v3.espacenet.com.

English-language Abstract of JP 10-050877, published Feb. 20, 1998, 1 page, printed from http://v3.espacenet.com.

English-language Translation of JP 11-102989, published Apr. 14, 1999, 24 pages.

English-language Abstract of JP 11-017064, published Jan. 22, 1999, 1 page, printed from http://v3.espacenet.com.

English-language Abstract of JP 2000-286294, published Oct. 13, 2000, 1 page, printed from http://v3.espacenet.com.

English-language Abstract of JP 2001-068512, published Mar. 16, 2001, 1 page, printed from http://v3.espacenet.com.

English-language Abstract of JP 61-049446, published Mar. 11, 1986, 1 page, printed from http://v3.espacenet.com.

English-language Abstract of JP 7-283336, published Oct. 27, 1995, 1 page, printed from http://v3.espacenet.com.

Ewanich, J. et al., "Development of a Tab (TCP) Ball Grid Array Package", *Proceedings of the 1995 International Electronics Packaging Conference*, San Diego, CA, Sep. 24-27, 1995, pp. 588-594.

Fauser, S. et al, "High Pin-Count PBGA Assembly", *Circuits Assembly*, Feb. 1995, vol. 6, No. 2, pp. 36-38 and 40.

Fauser, Suzanne et al., "High Pin Court PBGA Assembly: Solder Defect Failure Modes and Root Cause Analysis", *Surface International, Proceedings of The Technical Program*, Surface Mount International, Aug. 28-Sep. 1, 1994, San Jose, California, pp. 169-174.

Ferguson, M. "Ensuring High-Yield BGA Assembly", *Circuits Assembly*, Feb. 1995, vol. 6, No. 2, pp. 54, 56 and 58.

Freda, M., "Laminate Technology for IC Packaging", *Electronic Packaging & Production*, Cahners Publishing Company, Oct. 1995, vol. 35, No. 11, pp. S4-S5.

Freedman, M., "Package Size and Pin-Out Standardization", *Ball Grid Array National Symposium*, Mar. 29-30, 1995, 6 pages.

Freyman, B. and Pennisi, R., "Overmolded Plastic Pad Array Carriers (OMPAC): A Low Cost, High Interconnect Density IC Packaging Solution for Consumer and Industrial Electronics", *41st Electronic Components & Technology Conference*, IEEE, May 11-16, 1991, pp. 176-182.

Freyman, B. et al., "Surface Mount Process Technology for Ball Grid Array Packaging", *Surface Mount International Conference Proceedings*, Surface Mount International, Aug. 29-Sep. 2, 1993, San Jose, California, pp. 81-85.

Freyman, B. et al., "The Move to Perimeter Plastic BGAs", *Surface Mount International Conference Proceedings*, San Jose, CA, Aug. 29-31, 1995, pp. 373-382.

Freyman, B., "Trends in Plastic BGA Packaging," *Ball Grid Array National Symposium*, Dallas, Texas, Mar. 29-30, 1995, 44 pages.

Gilleo, K., "Electronic Polymers: Die Attach and Oriented Z-Axis Films", *Advanced Packaging*, IHS Publishing Group, Sep./Oct. 1994, vol. 3, No. 5, pp. 37-38, 40 and 42.

Guenin, B. et al., "Analysis of a Thermally Enhanced Ball Grid Array Package", *IEEE Transactions on Components, Packaging,* and *Manufacturing Technology, Part A*, IEEE Components, Packaging, and Manufacturing Technology Society, Dec. 1995, vol. 18, No. 4, pp. 749-757.

Hart, C. "Vias in Pads", *Circuits Assembly*, Feb. 1995, vol. 6, No. 2, pp. 42, 44-46 and 50.

Hart, C., "Vias in Pads for Coarse and Fine Pitch Ball Grid Arrays", *Surface Mount International Conference Proceedings*, Surface Mount International, Aug. 28-Sep. 1, 1994, San Jose, California, pp. 203-207.

Hattas, D., "BGAs Face Production Testing: New Package Offers Promise but Must Clear Technology Hurdles.", *Advanced Packaging*, IHS Publishing Group, Summer 1993, vol. 2, No. 3, pp. 44-46.

Hayden, T.F. et al., "Thermal & Electrical Performance and Reliability Results for Cavity-Up Enhanced BGAs", *Electronic Components and Technology Conference*, IEEE, 1999, pp. 638-644.

Heitmann, R., "A Direct Attach Evolution: TAB, COB and Flip Chip Assembly Challenges", *Advanced Packaging*, IHS Publishing Group, Jul./Aug. 1994, vol. 3, No. 4, pp. 95-99.

Hodson, T., "Study Examines BGA Use", *Electronic Packaging & Production*, Mar. 1993, page unknown.

Holden, H., "The Many Techniques of Small Via Formation for Thin Boards", *The Institute for Interconnecting and Packaging Electronic Circuits Ball Grid Array National Symposium*, San Diego, CA, Jan. 18-19, 1996, pp. 1-7.

Houghten, J., "New Package Takes On QFPs", *Advanced Packaging*, IHS Publishing Group, Winter 1993, vol. 2, No. 1, pp. 38-39.

Houghten, J.L., "Plastic Ball-Grid Arrays Continue To Evolve", *Electronic Design*, Feb. 6, 1995, pp. 141-146.

"How To Give Your BGAs A Better Bottom Line.", *Advanced Packaging*, IHS Publishing Group, May/Jun. 1995, page unknown.

Huang, W. and Ricks, J., "Electrical Characterization of PBGA for Communication Applications by Simulation and Measurement", *National Electronic Packaging and Production Conference West '95*, Feb. 26-Mar. 2, 1995, Anaheim, California, pp. 300-307.

Hundt, M. et al., "Thermal Enhancements of Ball Grid Arrays", *National Electronic Packaging and Production Conference West '95*, Reed Exhibition Companies, Anaheim, CA, Feb. 25-29, 1996, pp. 702-711.

Hutchins, C.L., "Understanding Grid Array Packages", *Surface Mount Technology Magazine*, IHS Publishing Group, Nov. 1994, vol. 8, No. 11, pp. 12-13.

Hwang, J.S., "A Hybrid of QFP and BGA Architecture", *Surface Mount Technology Magazine*, IHS Publishing Group, Feb. 1995, vol. 9, No. 2, p. 18.

Hwang, J.S., "Reliability of BGA Solder Interconnections", *Surface Mount Technology Magazine*, IHS Publishing Group, Sep. 1994, vol. 8, No. 9, pp. 14-15.

Johnson, R. et al., "A Feasibility Study of of Ball Grid Array Packaging", *National Electronic Packaging and Production Conference East '93*, Boston, Massachusetts, Jun. 14-17, 1993, pp. 413-422.

Johnson, R. et al., "Thermal Characterization of 140 and 225 Pin Ball Grid Array Packages", *National Electronic Packaging & Production Conference East '93*, Boston, Massachusetts, Jun. 14-17, 1993, pp. 423-430.

Johnston, P. "Printed Circuit Board Design Guidelines for Ball Grid Array Packages", *Journal of Surface Mount Technology*, Surface Mount Technology Association, Jan. 1996, vol. 9, pp. 12-18.

Johnston, P., "Land Pattern Interconnectivity Schemes", *Ball Grid Array National Symposium*, Dallas, Texas, Mar. 29-30, 1995, pp. 2-21.

Kamezos, M. , "An EPBGA Alternative," *Advanced Packaging*, Jun. 1998, pp. 90, 92, 94, and 96.

Kawahara, T. et al., "Ball Grid Array Type Package By Using of New Encapsulation Method", *Proceedings of the 1995 International Electronics Packaging Conference*, San Diego, CA, Sep. 24-27, 1995, pp. 577-587.

Knickerbocker, J.U. and Cole, M.S., "Ceramic BGA: A Packaging Alternative", *Advanced Packaging*, IHS Publishing Group, Jan./Feb. 1995, vol. 4, No. 1, pp. 20, 22 and 25.

Kromann, G., et al., "A Hi-Density C4/CBGA Interconnect Technology for a CMOS Microprocessor", *National Electronic Packaging and Production Conference West '95*, IEEE, Feb. 26-Mar. 2, 1995, Anaheim, California, pp. 1523-1529.

Kunkle, R., "Discrete Wiring for Array Packages", *Ball Grid Array National Symposium*, Dallas, Texas, Mar. 29-30, 1995, 9 pages.

Lall, B. et al., "Methodology for Thermal Evaluation of Multichip Modules", *IEEE Transactions on Components, Packaging, and Manufacturing Technology Part A*, IEEE, Dec. 1995, vol. 18, No. 4, pp. 758-764.

Lasance, C. et al., "Thermal Characterization of Electronic Devices with Boundary Condition Independent Compact Models", *IEEE Transactions on Components, Packaging, and Manufacturing Technology Part A*, IEEE Components, Packaging, and Manufacturing Technology Society, Dec. 1995, vol. 18, No. 4, pp. 723-731.

Lau, J. et al., "No Clean Mass Reflow of Large Plastic Ball Grid Array Packages", *Circuit World*, Wela Publications Ltd., vol. 20, No. 3, Mar. 1994, pp. 15-22.

Lau, J., *Ball Grid Array Technology*, McGraw-Hill Inc., 1995, entire book submitted.

"Literature Review", Special Supplements to *Electronic Packaging & Production*, Feb. 1995, Cahners Publication, 10 pages.

*LSI LOGIC Package Selector Guide, Second Edition*, LSI Logic Corporation, 1994-1995, entire document submitted.

"LTCC MCMs Lead to Ceramic BGAs," *Advanced Packaging*, IHS Publishing Group, Sep./Oct. 1994, vol. 3, No. 5, pp. 14-15.

Mark, Dr. W.C. et al., "Increased SOIC Power Dissipation Capability Through Board Design and Finite Element Modeling", *Journal of Surface Mount Technology*, Surface Mount International, Oct. 1994, pp. 33-41.

Marrs, R. et al., "Recent Technology Breakthrough Achieved with the New *Super/BGA®* Package", *1995 International Electronics Packaging Conference*, San Diego, California, Sep. 24-27, 1995, pp. 565-576.

Marrs, R.C. and Olachea, G., "BGAs For MCMs: Changing Markets and Product Functionality", *Advanced Packaging*, IHS Publishing Group, Sep./Oct. 1994, vol. 3, No. 5, pp. 48, 50, and 52.

Matthew, L.C. et al., "Area Array Packaging: KGD in a Chip-Sized Package", *Advanced Packaging*, IHS Publishing Group, Jul./Aug. 1994, pp. 91-94.

Mawer, A. et al., "Plastic BGA Solder Joint Reliability Considerations", *Surface Mount International Conference Proceedings*, Surface Mount International, Aug. 28-Sep. 1, 1994, San Jose, California, pp. 239-251.

Mazzullo, T. and Schaertl, L., Schaertl, L., "How IC Packages Affect PCB Design", *Surface Mount Technology Magazine*, Feb. 1995, vol. 9, No. 2, pp. 114-116.

Mearing, J., "An Overview of Manufacturing BGA Technology", *National Electronic Packaging and Production Conference West '95*, Feb. 26-Mar. 2, 1995, Anaheim, California, pp. 295-299.

Mertol, A., "Application of the Taguchi Method on the Robust Design of Molded 225 Plastic Ball Grid Array Packages", *IEEE Transactions on Components, Packaging, and Manufacturing Technology Part B: Advanced Packaging*, IEEE, Nov. 1995, vol. 18, No. 4, pp. 734-743.

Mescher, P. and Phelan, G., "A Practical Comparison of Surface Mount Assembly for Ball Grid Array Components", *Surface Mount International Conference Proceedings*, Surface Mount International, Aug. 28-Sep. 1, 1994, San Jose, California, pp. 164-168.

Mulgaonker, S. et al., "An Assessment of the Thermal Performance of the PBGA Family", *Eleventh Annual IEEE Semiconductor Thermal Measurement and Management Symposium*, IEEE, San Jose, CA, Feb. 7-9, 1995, pp. 17-27.

"New PBGA Pushes Technology to Outer Limits", *Advanced Packaging*, HIS Publishing Group, Jan./Feb. 1995, p. 11.

Olachea, G., "Managing Heat: A Focus on Power IC Packaging", *Electronic Packaging & Production (Special Supplement)*, Cahners Publishing Company, Nov. 1994, pp. 26-28.

"Pad Array Improves Density", *Electronic Packaging & Production*, Cahners Publishing Company, May 1992, pp. 25-26.

Partridge, J. and Viswanadham, P., "Organic Carrier Requirements for Flip Chip Assemblies", *Journal of Surface Mount Technology*, Surface Mount Technology Association, Jul. 1994, pp. 15-20.

Ramirez, C. and Fauser, S., "Fatigue Life Comparison of The Perimeter and Full Plastic Ball Grid Array", *Surface Mount Inter-*

*national Proceedings*, Surface Mount International, Aug. 28-Sep. 1, 1994, San Jose, California, pp. 258-266.

Rogren, P., "MCM-L Built on Ball Grid Array Formats", *National Electronic Packaging and Production Conference West '94*, Feb. 27-Mar. 4, 1994, Anaheim, California, pp. 1277-1282.

Rooks, S., "X-Ray Inspection of Flip Chip Attach Using Digital Tomosynthesis", *Surface Mount International Proceedings of The Technical Program*, Aug. 28-Sep. 1, 1994, San Jose, California, pp. 195-202.

Rukavina, J., "Attachment Methodologies: Ball Grid Array Technology", *Ball Grid Array National Symposium*, Dallas, Texas, Mar. 29-30, 1995, 36 pages.

Sack, T., "Inspection Technology", *Ball Grid Array National Symposium*, Dallas, Texas, Mar. 29-30, 1995, pp. 1-41.

Sakaguchi, H., "BGA Mounting Technology," pp. 1-4, date and source unknown.

Schmolze, C. and Fraser, A., "SPICE Modeling Helps Enhance BGA Performance", *Electronic Packaging & Production*, Jan. 1995, pp. 50-52.

Schueller, R.D. et al., "Performance and Reliability of a Cavity Down Tape BGA Package," *IEEE Electronic Packaging Technology Conference*, 1997, pp. 151-162.

*Semiconductor Group Package Outlines Reference Guide*, Texas Instruments, 1995, entire document submitted.

Shimizu, J., "Plastic Ball Grid Array Coplanrity", *Surface Mount International Conference*, San Jose, California, Aug. 31-Sep. 2, 1993, pp. 86-91.

Sigliano, R., "Using BGA Packages: An Appealing Technology in a QFP and Fine-Pitch Market", *Advanced Packaging*, IHS Publishing Group, Mar./Apr. 1994, pp. 36-39.

Sirois, L., "Dispensing for BGA: Automated Liquid Dispensing in a High-Density Environment", *Advanced Packaging*, IHS Publishing Group, May/Jun. 1995, pp. 38 and 41.

Solberg, V., "Interconnection Structure Preparation: Impact of Material Handling and PCB Surface Finish on SMT Assembly Process Yield", *Ball Grid Array National Symposium*, Dallas Texas, Mar. 29-30, 1995, 9 pages.

"Survival of the Fittest", *Advanced Packaging*, IHS Publishing Group, Mar./Apr. 1995, page unknown.

Thompson, T., "Reliability Assessment of a Thin (Flex) BGA Using a Polyimide Tape Substrate", *International Electronics Manufacturing Technology Symposium*, IEEE, 1999, pp. 207-213.

Tuck, J., "BGA Technology Branches Out", *Circuits Asssembly*, Feb. 1995, vol. 6, No. 2, pp. 24, 26, and 28.

"Tutorial and Short Courses", *45th Electronic Components & Technology Conference*, May 21-24, 1995, Las Vegas, Nevada, IEEE, 4 pages.

Vardaman, E. J. and Crowley, R.T., "Worldwide Trends In Ball Grid Array Developments", *National Electronic Packaging and Production Conference West '96*, Reed Exhibition Companies, Anaheim, CA, Feb. 25-29, 1996, pp. 699-701.

Walshak, D. and Hashemi, H., "BGA Technology: Current and Future Direction for Plastic, Ceramic and Tape BGAs", *Surface Mount International Conference Proceedings*, Surface Mount International, Aug. 28-Sep. 1, 1994, San Jose, California, pp. 157-163.

Walshak, D. and Hashemi, H., "Thermal Modeling of a Multichip BGA Package", *National Electronic Packaging and Production Conference West '94*, Reed Exhibition Companies, Anaheim, California, Feb. 27-Mar. 4, 1994, pp. 1266-1276.

Xie, H. et al., "Thermal Solutions to Pentium Processors in TCP in Notebooks and Sub-Notebooks", *45th Electronic Components & Technology Conference*, IEEE, Las Vegas, NV, May 21-24, 1995, pp. 201-210.

Yip, W.Y., "Package Characterization of a 313 Pin BGA", *National Electronic Packaging and Production Conference West '95*, Reed Exhibition Companies, Feb. 26-Mar. 2, 1995, Anaheim, California, pp. 1530-1541.

Zamborsky, E., "BGAs in the Assembly Process", *Circuits Assembly*, Feb. 1995, vol. 6, No. 2, pp. 60, 62-64.

Zhao, Z., Ph.D., "IC Package Thermal Issues and Thermal Design," ASAT, Inc., Jan. 14, 2000, 98 pages, presented at $2^{nd}$ *International Icepak User's Group Meeting*, Palo Alto, CA, on Feb. 7, 2000.

Zhao, Z., Ph.D., "Thermal Design and Modeling of Packages," *IEEE Short Courses*, Broadcom Corporation, Oct. 25, 2000, 95 pages.

Zimerman, M., "High Performance BGA Molded Packages for MCM Application", *Surface Mount International Conference Proceedings*, Surface Mount International, Aug. 28-Sep. 1, 1994, San Jose, California, pp. 175-180.

Zweig, G., "BGAs: Inspect the Process, Not the Product", *Electronic Packaging & Production (Special Supplement)*, Cahners Publishing Company, Aug. 1994 (Supplement), p. 41.

Freyman, B. and Petrucci, M., "High-Pincount PBGAs: Implementation Into Volume Manufacturing," *Advanced Packaging*, An IHS Group Publication, May/Jun. 1995, pp. 44-46.

English-language Abstract of FR 2803098, published Jun. 29, 2001, 1 page, printed from http://v3.espacenet.com.

English-language Summary of Decision of Rejection from Taiwanese Application No. 91108573, 5 pages.

Zhao et al., U.S. Appl. No. 10/284,340, filed Oct. 31, 2002, entitled "Ball Grid Array Package With Patterned Stiffener Layer," 137 pages.

Amkow package data sheet, "SuperFC®", from http://www.amkor.com/Products/all_datasheets/superfc.pdf, 2 pages (Jan. 2003).

Andros, F., "Tape Ball Grid Array," from Puttlitz, K.J. and Totta, P.A. (eds.), *Area Array Interconnecetion Handbook*, pp. 619-620, ISBN No. 0-7923-7919-5, Kluwer Academic Publishers (2001).

Brofman, P.J. et al., "Flip-Chip Die Attach Technology," Puttlitz, K.J. and Totta, P.A. (eds.), *Area Array Interconnection Handbook*, pp. 315-349, ISBN No. 0-7923-7919-5, Kluwer Academic Publishers (2001).

Ghosal, B. et al., "Ceramic and Plastic Pin Grid Array Technology," Puttlitz, K.J. and Totta, P.A. (eds.), *Area Array Interconnection Handbook*, pp. 551-576, ISBN No. 0-7923-7919-5, Kluwer Academic Publishers (2001).

Harper, C.A. (ed.), *Electronic Packaging And Interconnection Handbook*, Third Edition, pp. 7.58-7.59, ISBN No. 0-07-134745-3, McGraw-Hill Companies (2000).

Lin, S. and Chang, N., "Challenges in Power-Ground Integrity," *Proceedings Of The 2001 International Conference On Computer-Aided Design*, pp. 651-654 (Nov. 4-8, 2001).

Lloyd, J. and Overhauser, D., "Electromigration wreaks havoc on IC design," *EDN*, pp. 145-148 (Mar. 26, 1998).

Song, W.S. and Glasser, L.A., "Power Distribution Techniques for VLSI Circuits," *IEEE Journal Of Solid-State Circuits*, vol. SC-21, No. 1, pp. 150-156 (Feb. 1986).

Tang, K.T. and Friedman, E.G., "Simultaneous Switching Noise in On-Chip CMOS Power Distribution Networks," *IEEE Transactions On Very Large Scale Integration (VLSI) Systems*, vol. 10, No. 4, pp. 487-493 (Aug. 2002).

\* cited by examiner

STIFFENER TEMPERATURE DISTRIBUTION

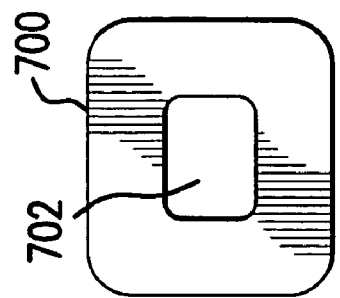
FIG.7B
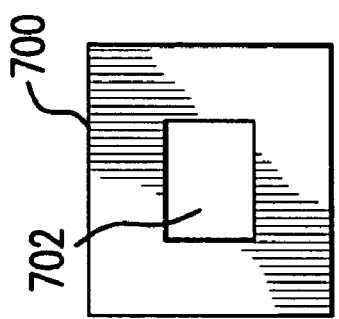
FIG.7A
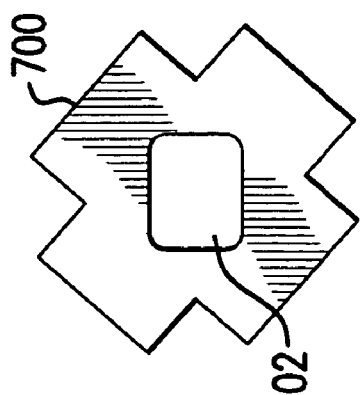
FIG.7D
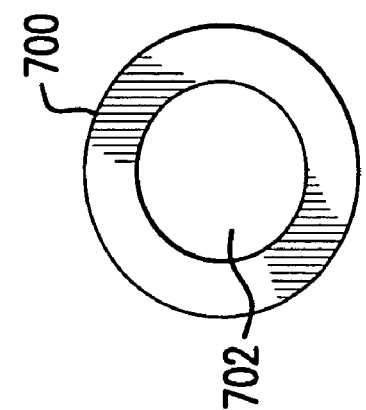
FIG.7C
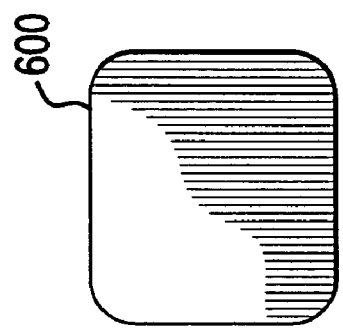
FIG.6B
FIG.6D
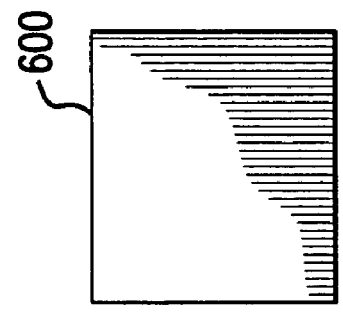
FIG.6A
FIG.6C

METHOD FOR ASSEMBLING A BALL GRID ARRAY PACKAGE WITH MULTIPLE INTERPOSERS

CROSS-REFERENCE TO RELATED APPLICATIONS

This application is a continuation of U.S. application No. 10/284,166, titled, "Ball Grid Array Package With Multiple Interposers," filed Oct. 31, 2002, now U.S. Pat. No. 6,861,750, which claims the benefit of U.S. Provisional application No. 60/352,877, filed Feb. 1, 2002, both of which are herein incorporated by reference in their entireties.

The following applications of common assignee are related to the present application, have the same filing date as the present application, and are herein incorporated by reference in their entireties:

"Ball Grid Array Package Enhanced with a Thermal and Electrical Connector," Ser. No. 10/284,312;

"Ball Grid Array Package with Patterned Stiffener Layer," Ser. No. 10/284,340;

"Ball Grid Array Package with Stepped Stiffener Layer," Ser. No. 10/284,371;

"Ball Grid Array Package Fabrication with IC Die Support Structures," Ser. No. 10/284,349, and "Ball Grid Array Package with Separated Stiffener Layer," Ser. No. 10/284,366.

BACKGROUND OF THE INVENTION

1. Field of the Invention

The invention relates generally to the field of integrated circuit (IC) device packaging technology and, more particularly, to substrate stiffening and heat spreading techniques in ball grid array (BGA) packages.

2. Background Art

Integrated circuit (IC) dies are typically mounted in or on a package that facilitates attachment to a printed circuit board (PCB). One such type of IC die package is a ball grid array (BGA) package. BGA packages provide for smaller footprints than many other package solutions available today. A BGA package has an array of solder balls located on a bottom external surface of a package substrate. The solder balls are reflowed to attach the package to the PCB. In one type of BGA package, the IC die is mounted to a top surface of the package substrate. Wire bonds typically couple signals in the IC die to the substrate. The substrate has internal routing which electrically couples the IC die signals to the solder balls on the bottom substrate surface.

A number of BGA package substrate types exist, including ceramic, plastic, and tape (also known as "flex"). In some BGA package types, a stiffener may be attached to the substrate to supply planarity and rigidity to the package. In such packages, the IC die may be mounted to the stiffener instead of the substrate. Openings in the stiffener may be used to allow the IC die to be wire-bonded to the substrate.

Die-up and die-down BGA package configurations exist. In die-up BGA packages, the IC die is mounted on a top surface of the package, opposite of the side to which the solder balls are attached. In die-down BGA packages, the IC die is mounted on a bottom surface of the package, on the same side as which the solder balls are attached.

Existing BGA packages are subject to high thermal stresses that result from the heat given off during operation of the mounted IC die. The thermal stresses are primarily imposed on the IC die and solder balls due to the mismatch of the thermal expansion coefficient (CTE) between the semiconductor die and the metal stiffener. As a result, conventional flex BGA packages have difficulty in meeting reliability requirements for die sizes larger than about 9 mm. See, e.g., Thompson, T., et al., Reliability Assessment of a Thin (Flex) BGA Using a Polyimide Tape Substrate, International Electronics Manufacturing Technology Symposium, IEEE, pp. 207–213 (1999).

The tape substrate used in flex BGA packages is typically polyimide, which has very low values of thermal conductivity. Consequently, the IC die is separated from the PCB internally by the tape substrate thermal barrier. The lack of direct thermal connection from IC die to PCB leads to relatively high resistance to heat transfer from IC die-to-board (theta-jb).

A stiffener attached to a substrate enhances heat spreading. However, the openings on the stiffener for wire bond connections tend to reduce the thermal connections between the IC die and the edges of the stiffener. As a result, heat spreading is limited largely to the region of the IC die attach pad, while areas at the stiffener peripheral do not contribute effectively to heat spreading.

Furthermore, because of the high density of the substrate routing circuitry, it is difficult to bond each power and ground pad on the IC die to the substrate by a corresponding bond finger. As a result, the distribution of ground and power signals connecting to the IC die is frequently compromised in conventional BGA packages.

Ball grid array packages that use plastic substrates (for example, BT or FR4 plastic) are commonly known as plastic BGAs, or PBGAs. See, e.g., Lau, J. H., Ball Grid Array Technology, McGraw-Hill, New York, (1995). A PBGA package, for example, may add solder balls to the bottom substrate surface under the IC die to aid in conducting heat to the PCB. Solder balls such as these are referred to as thermal balls. The cost of the PBGA package, however, will increase with the number of thermal balls. Furthermore, a large array of thermal balls may be necessary for heat dissipation into the PCB for high levels of IC device power.

Hence, what is needed are BGA packages with improved heat spreading capabilities, which also provide high levels of IC electrical performance.

Furthermore, what is needed are improved BGA packages with enhanced electrical, thermal and physical characteristics.

BRIEF SUMMARY OF THE INVENTION

Ball grid array (BGA) packages having enhanced electrical, thermal, and mechanical characteristics are described herein. In an aspect, an apparatus and method for a ball grid array (BGA) package is described. A first stiffener has opposing first and second surfaces. The first surface of the first stiffener is capable of receiving mounting of an IC die thereon. A second stiffener has opposing first and second surfaces. An opening through the second stiffener is open at the first and second surfaces of the second stiffener. A peripheral edge portion of the second surface of the first stiffener is attached to the first surface of the second stiffener to cover the opening at the first surface of the second stiffener. A substrate has a plurality of contact pads on a first surface of the substrate that are electrically connected through the substrate to a plurality of solder ball pads on a second surface of the substrate. The second surface of the second stiffener is attached to the first surface of the substrate.

In a further aspect of the present invention, an IC die is mounted to the first surface of the first stiffener.

In another aspect, the substrate has an opening therethrough. A heat spreader is attached to the second surface of the first stiffener through the opening in the second stiffener and the opening in the substrate. In a further aspect, a surface of the heat spreader is capable of being attached to a PCB when the BGA package is mounted on the PCB.

In an alternative aspect, the first stiffener includes a protruding portion located in a central region of the first surface of the first stiffener. The protruding portion extends through the opening in the second stiffener and the opening in the substrate. In a further aspect, a surface of the protruding portion is capable of being attached to a PCB when the BGA package is mounted on the PCB.

In another aspect, a first wire bond couples a first bond pad of the IC die to the first stiffener. A second wire bond couples a second bond pad of the IC die to the second stiffener. A third wire bond couples a third bond pad of the IC die to a first contact pad of the plurality of contact pads on the first surface of the substrate. The second stiffener has a second opening that is open at the first and the second surfaces of the second stiffener. The third wire bond couples the bond pad to the first contact pad through the second opening.

In another aspect, at least one area of at least one of the first surface of the first stiffener and the first surface of the second stiffener is plated with an electrically conductive material.

In another aspect, an encapsulating material is applied to encapsulate the IC die.

The first and second stiffeners of the present invention provide numerous benefits. These benefits include increased stiffness/rigidity to the BGA package, greater heat transfer, additional ground/power/signal planes, and additional benefits. Further aspects, features, and advantages of the present invention, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIGS. 6A–6D and 7A–7D show example stiffeners, according to embodiments of the present invention.

FIGS. 8, 9, 10, and 11A show cross-sectional views of example BGA packages, according to embodiments of the present invention.

Figure 11A:
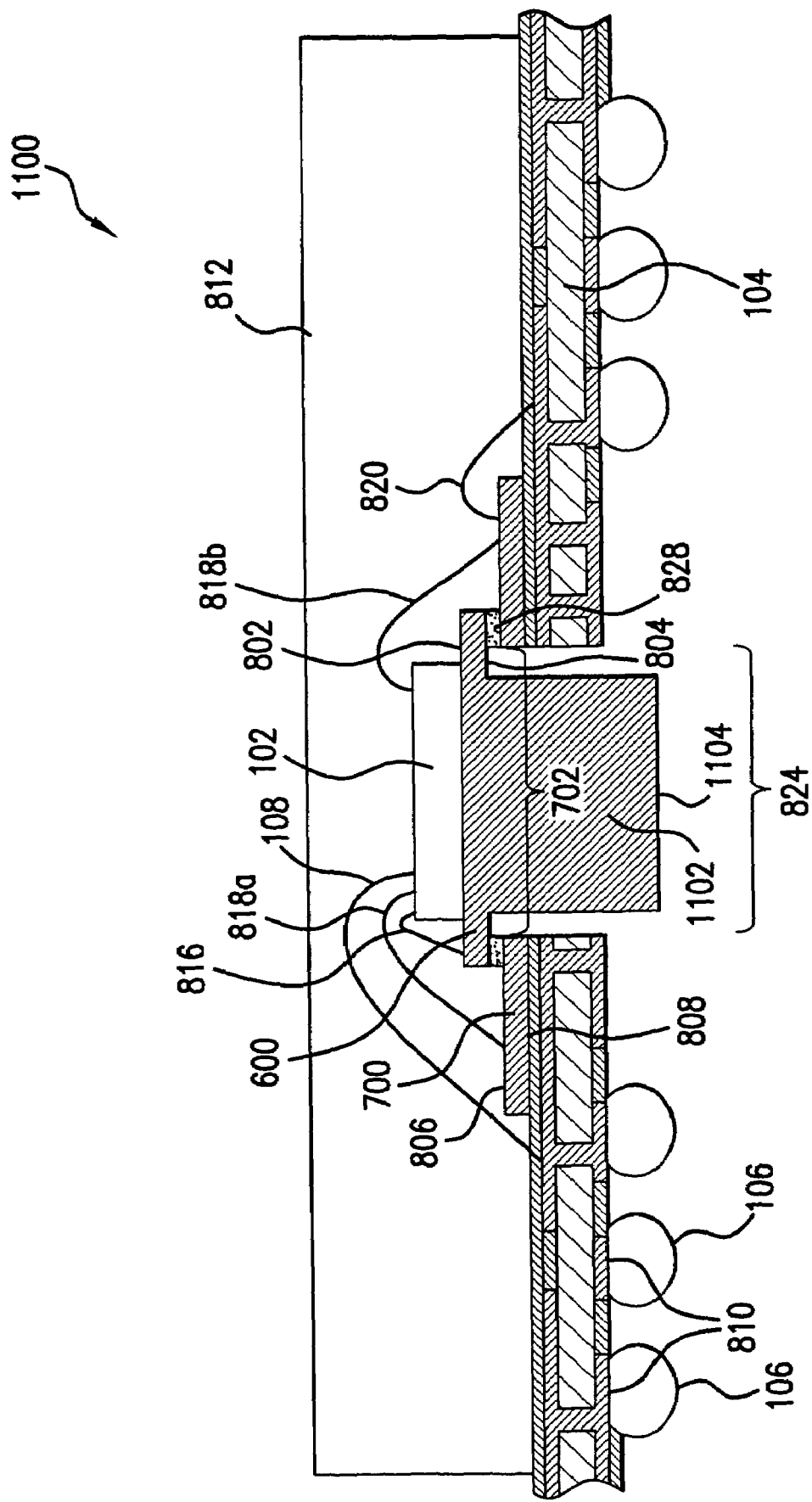
Figure 11B:
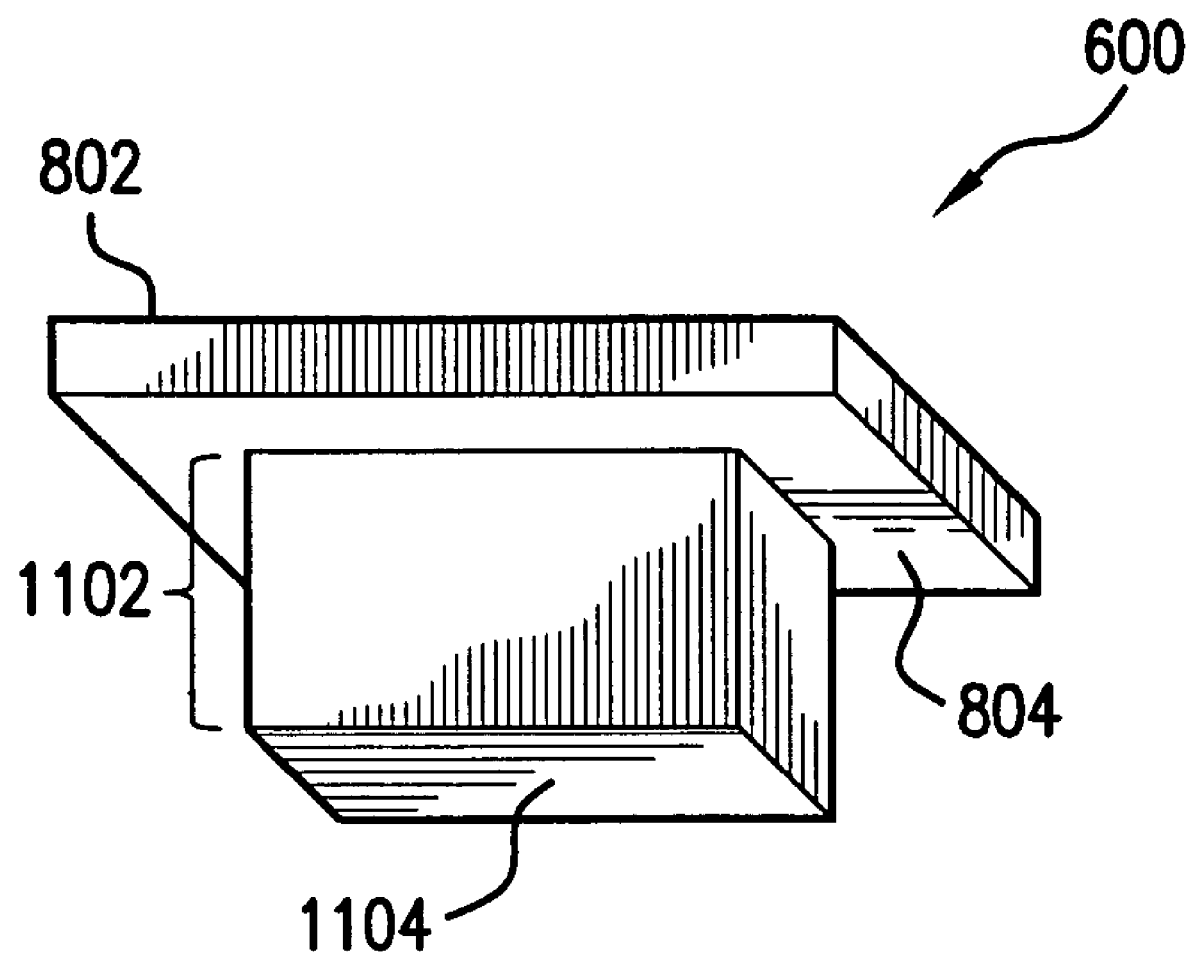

FIG. 11B shows an example stiffener, according to an embodiment of the present invention.

Figure 12:
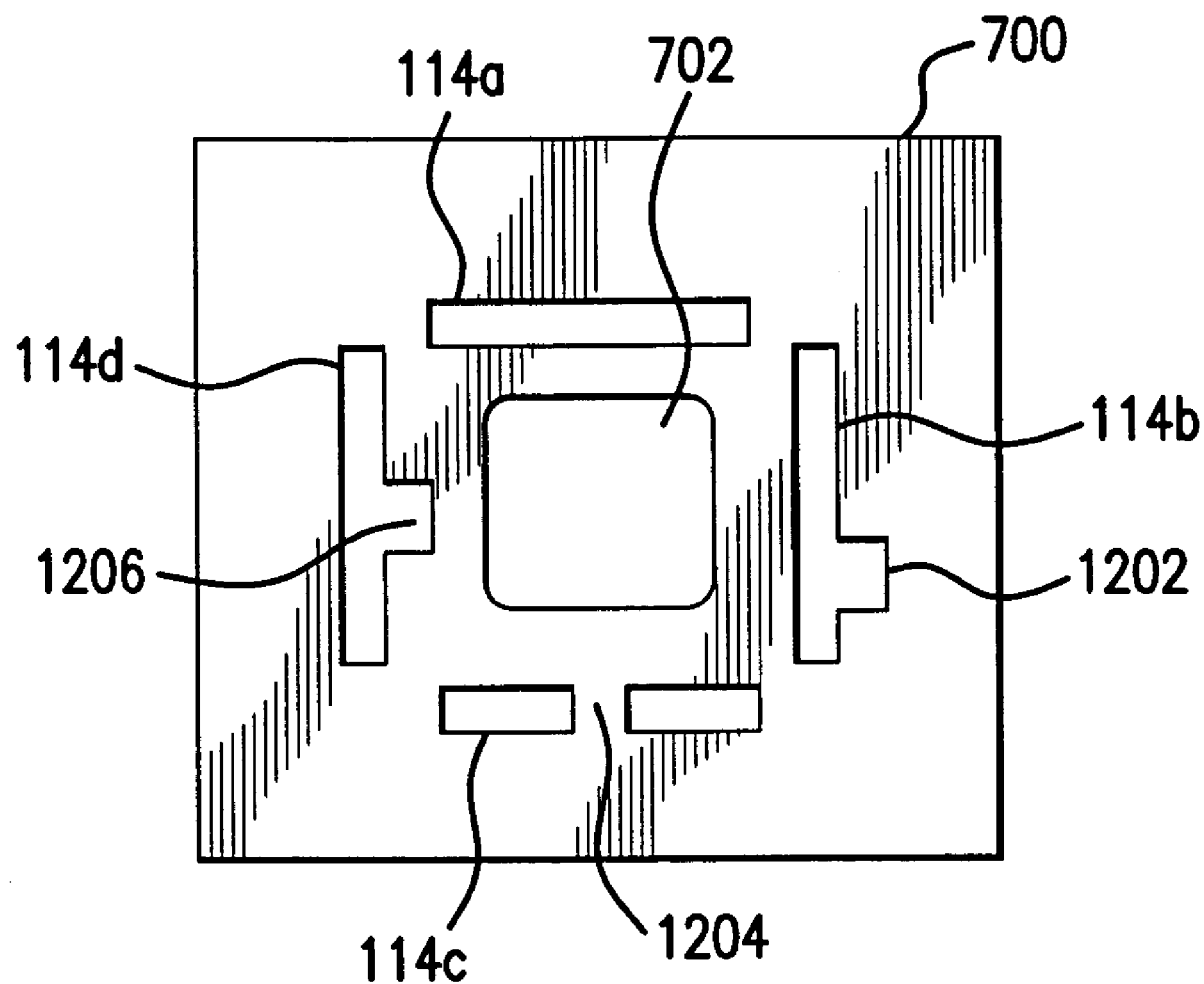

FIG. 12 shows an example stiffener, according to an embodiment of the present invention.

FIGS. 13–16 show cross-sectional views of example BGA packages, according to embodiments of the present invention.

Figure 17A:
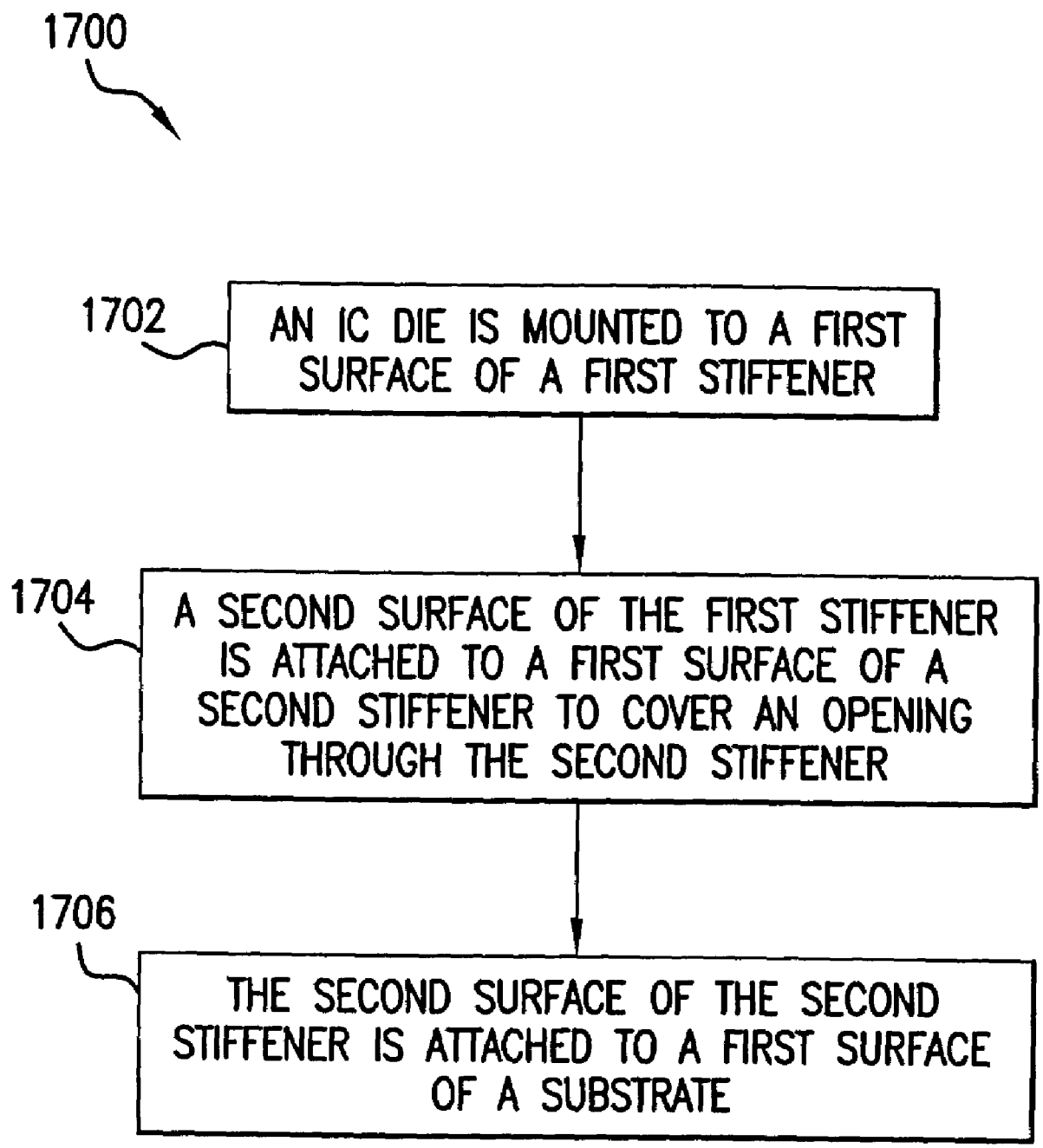
Figure 17B:
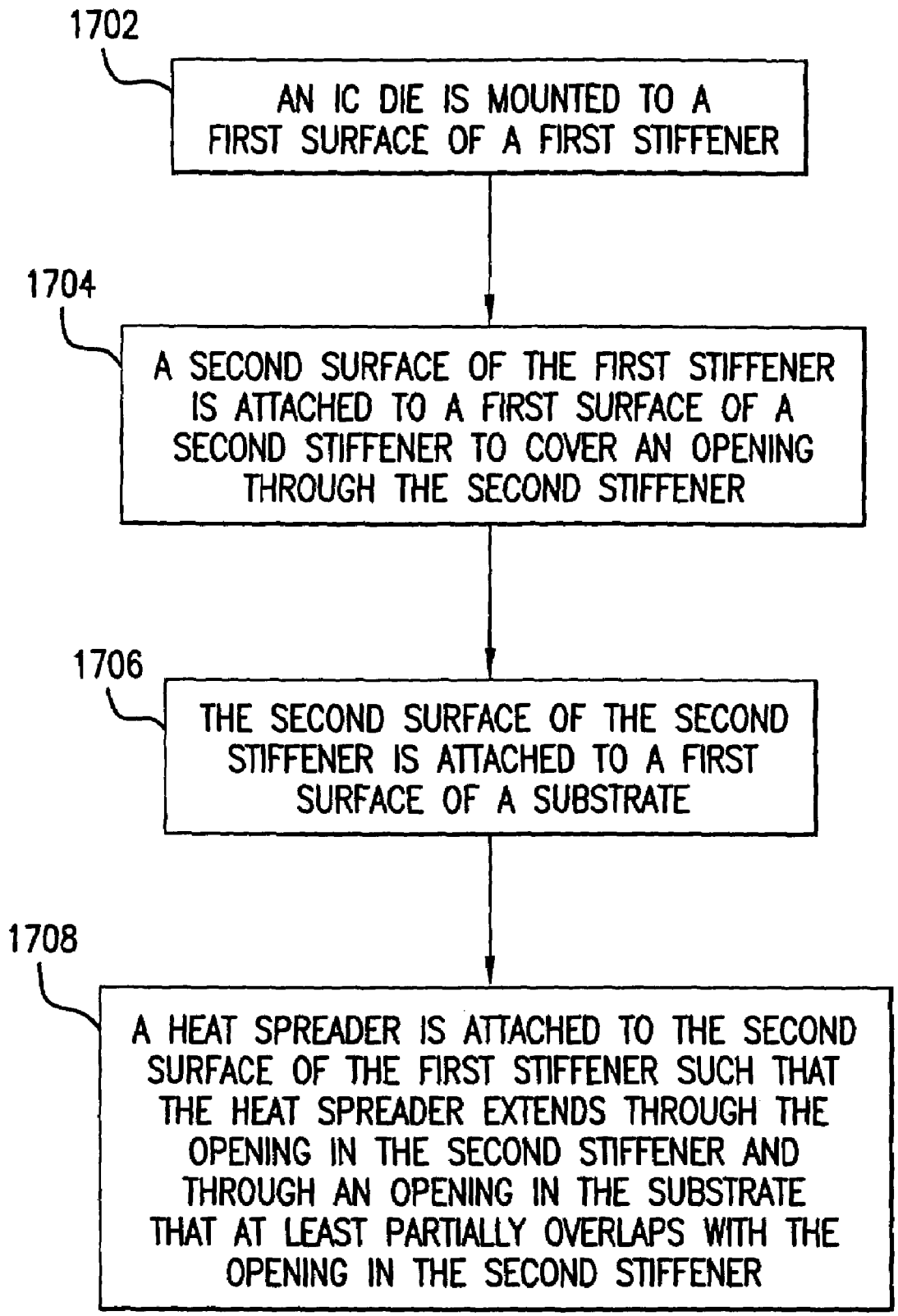
Figure 17C:
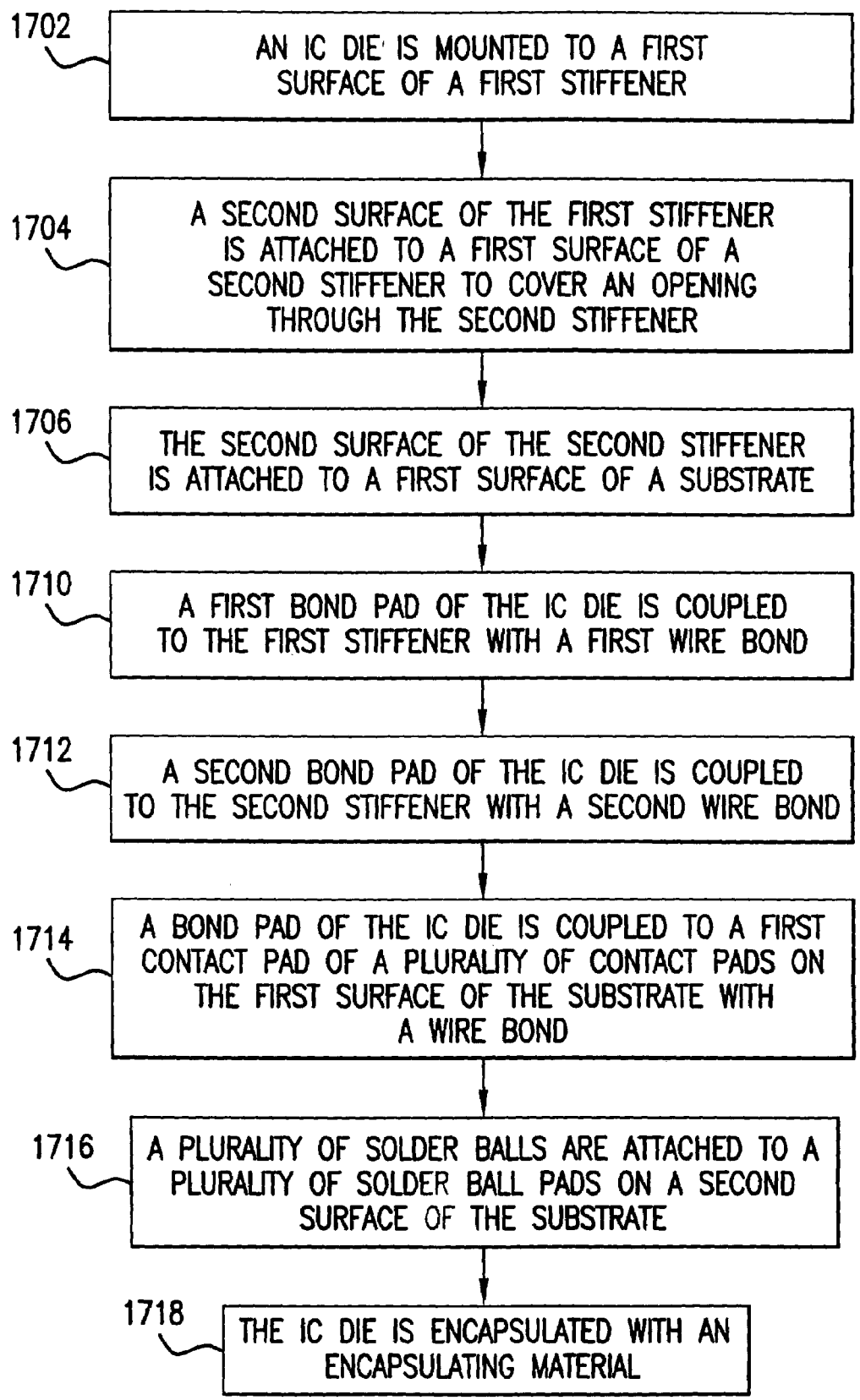

FIGS. 17A–17C show flowcharts providing example steps for assembling a BGA package according to embodiments of the present invention.

Figure 18:
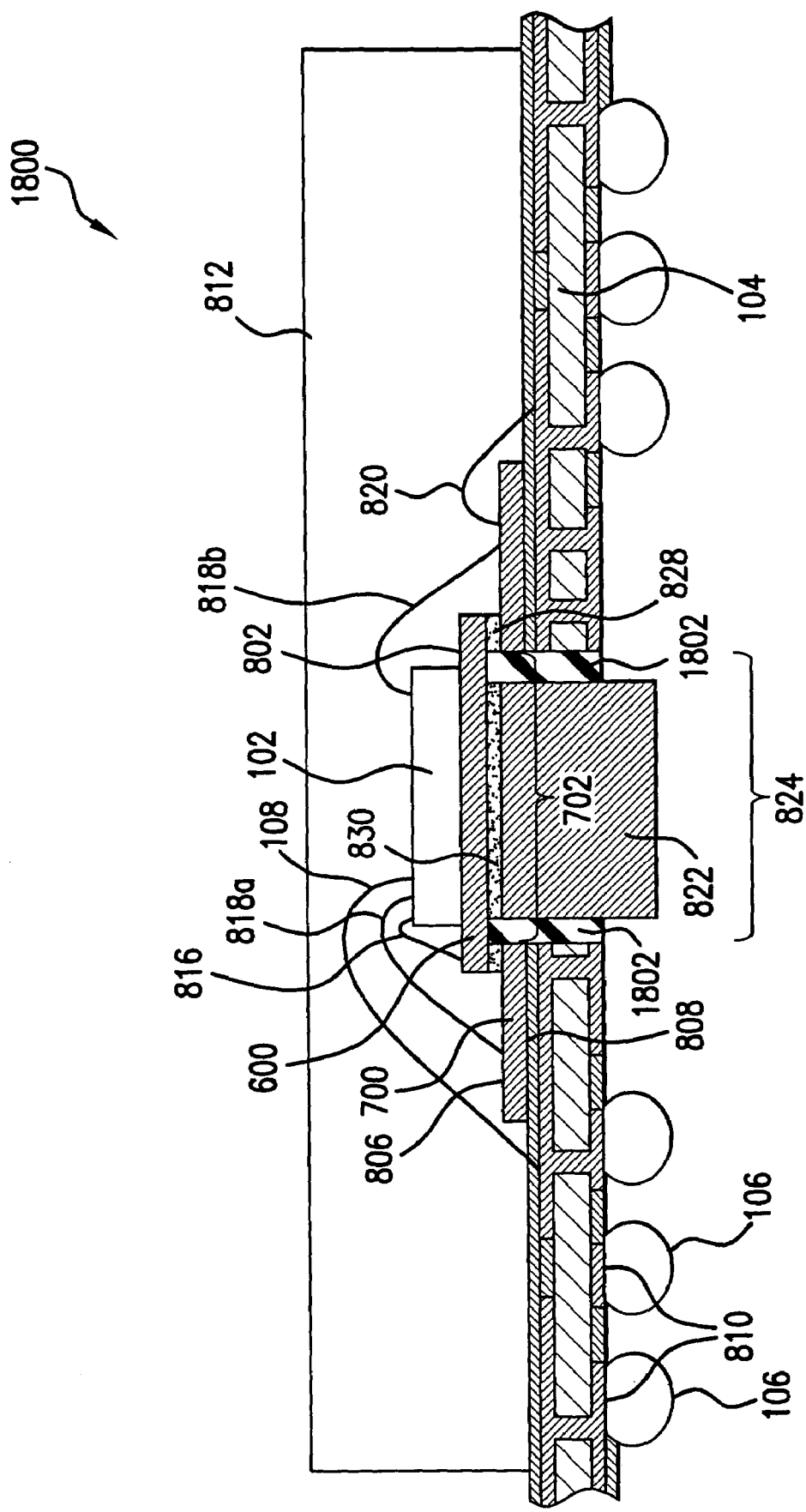

FIG. 18 shows a cross-sectional view of BGA package with seal ring, according to an embodiment of the present invention.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Overview

The present invention is directed to a method, system, and apparatus for improving the mechanical, thermal, and electrical performance of BGA packages. The present invention is applicable to all types of BGA substrates, including ceramic, plastic, and tape (flex) BGA packages. Furthermore the present invention is applicable to die-up (cavity-up) and die-down (cavity-down) orientations.

Numerous embodiments of the present invention are presented herein. First, ball grid array package types are described below. Next, further detail on the above described embodiments for assembling BGA packages with two or more stiffeners, and additional embodiments according to the present invention, are described. The embodiments described herein may be combined as required by a particular application.

Ball Grid Array (BGA) Package

A ball grid array (BGA) package is used to package and interface an IC die with a printed circuit board (PCB). BGA packages may be used with any type of IC die, and are particularly useful for high speed ICs. In a BGA package, solder pads do not just surround the package periphery, as in chip carrier type packages, but cover most or all of the bottom package surface in an array configuration. BGA packages are also referred to as pad array carrier (PAC), pad array, land grid array, and pad-grid array packages. BGA packages types are further described in the following paragraphs. For additional description on BGA packages, refer to Lau, J. H., Ball Grid Array Technology, McGraw-Hill, N.Y., (1995), which is herein incorporated by reference in its entirety.

Die-up and die-down BGA package configurations exist. In die-up BGA packages, the IC die is mounted on a top surface of the substrate or stiffener, in a direction away from the PCB. In die-down BGA packages, the IC die is mounted on a bottom surface of the substrate or stiffener, in a direction towards the PCB.

Figure 1A:
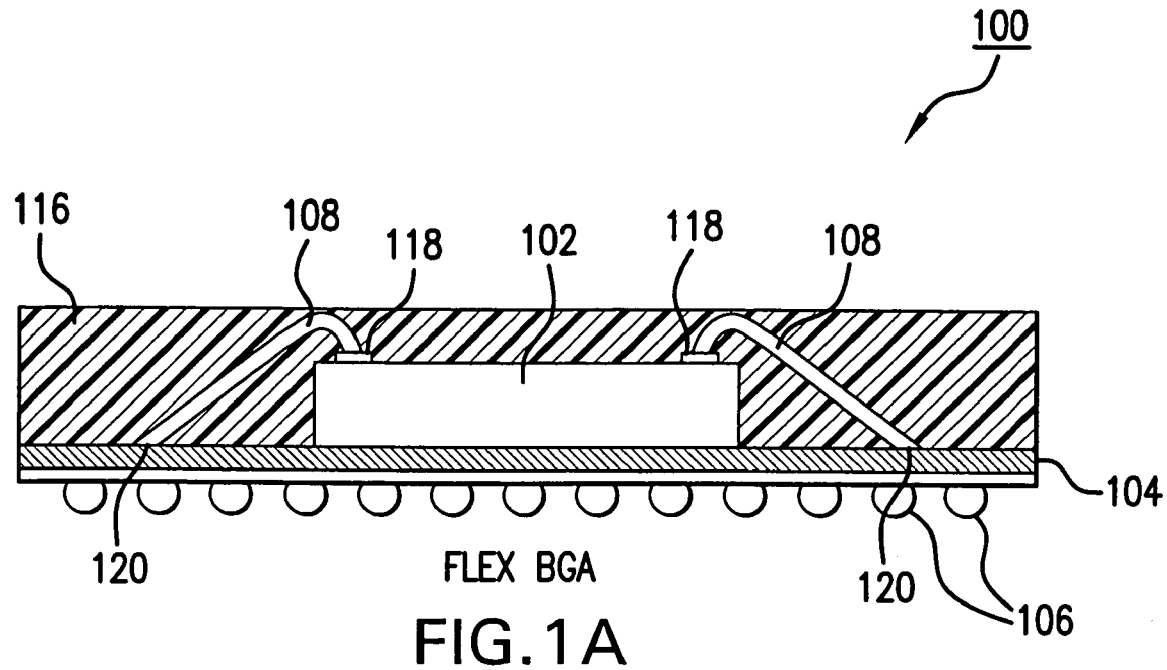
FIGS. 1A and 1B illustrate cross-sectional views of flex BGA packages.

A number of BGA package substrate types exist, including ceramic, plastic (PBGA), and tape (also known as "flex") (for example, refer to Hayden, T. F., et al., Thermal & Electrical Performance and Reliability Results for Cavity-Up Enhanced BGAs, Electronic Components and Technology Conference, IEEE, pp. 638–644 (1999), which is incorporated herein by reference). FIG. 1A illustrates a flex BGA package 100. Flex BGA package 100 includes an IC die 102, a tape substrate 104, a plurality of solder balls 106, and one or more wire bonds 108. Tape or flex BGA packages are particularly appropriate for large IC dies with large numbers of inputs and outputs, such as application specific integrated circuits (ASIC) and microprocessors.

Tape substrate 104 is generally made from one or more conductive layers bonded with a dielectric material. For instance, the dielectric material may be made from various substances, such as polyimide tape. The conductive layers are typically made from a metal, or combination of metals, such as copper and aluminum. Trace or routing patterns are made in the conductive layer material. Substrate 104 may be a single-layer tape, a two-layer tape, or additional layer tape substrate type. In a two-layer tape, the metal layers sandwich the dielectric layer, such as in a copper-Upilex-copper arrangement.

IC die 102 is attached directly to substrate 104, for example, by an epoxy. IC die 102 is any type of semiconductor IC.

One or more wire bonds 108 connect corresponding bond pads 118 on IC die 102 to contact pads or points 120 on substrate 104.

An encapsulate 116, such as a mold compound, epoxy, or other encapsulating material, covers IC die 102 and wire bonds 108 for mechanical and environmental protection.

Figure 1B:
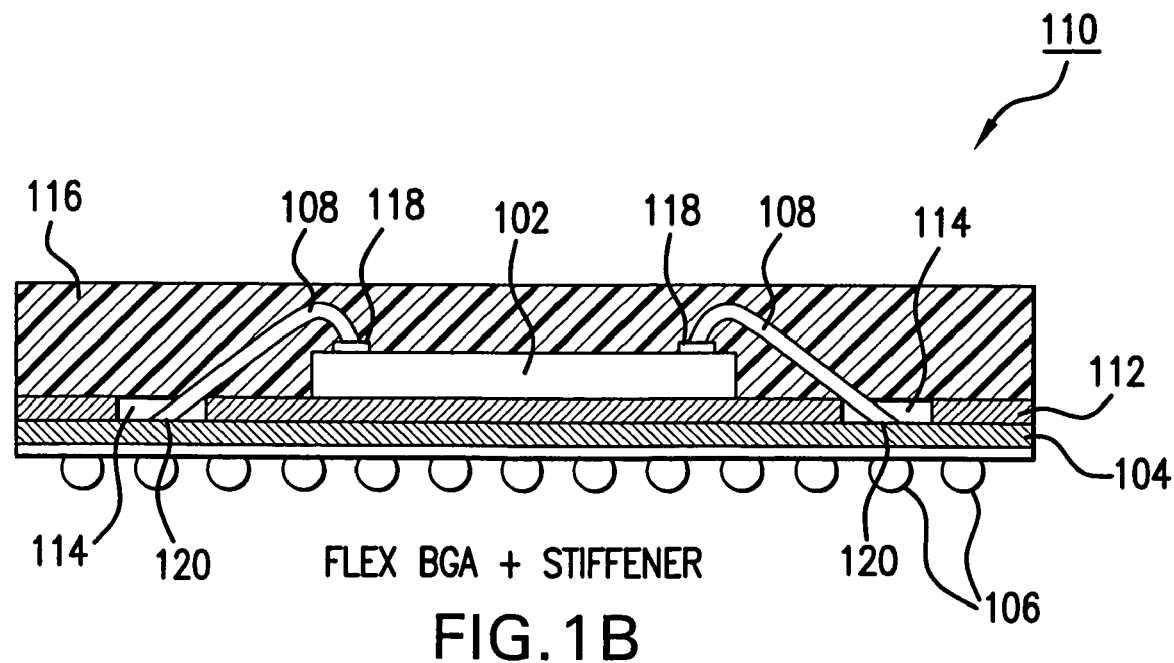

As shown in FIG. 1A, flex BGA package 100 does not include a stiffener. In some BGA package types, particularly in flex BGA packages, a stiffener can be attached to the substrate to add planarity and rigidity to the package. FIG. 1B illustrates a flex BGA package 110, similar to flex BGA package 100, that incorporates a stiffener 112. Stiffener 112 may be laminated or otherwise attached to substrate 104. Stiffener 112 is typically made from a metal, or combination of metals, such as copper, tin, and aluminum, or may be made from a polymer and other materials, for example. Stiffener 112 also may act as a heat sink, and allow for greater heat spreading in BGA package 110. One or more openings 114 in stiffener 112 may be used to allow for wire bonds 108 to connect IC die 102 to substrate 104. Stiffener 112 may be configured in other ways, and have different opening arrangements than shown in FIG. 1B.

Figure 2A:
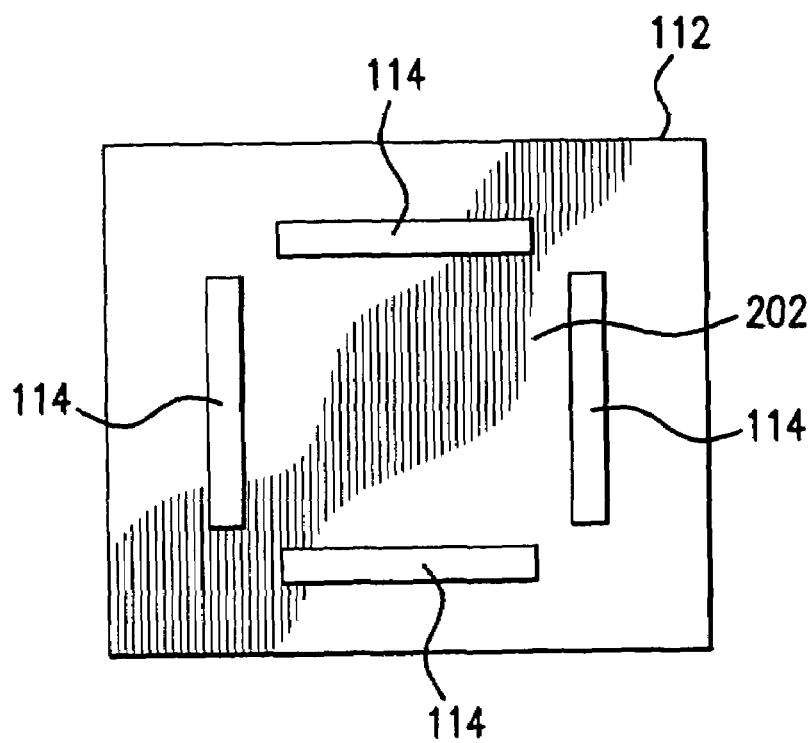
FIG. 2A shows a top view of a stiffener.
Figure 2B:
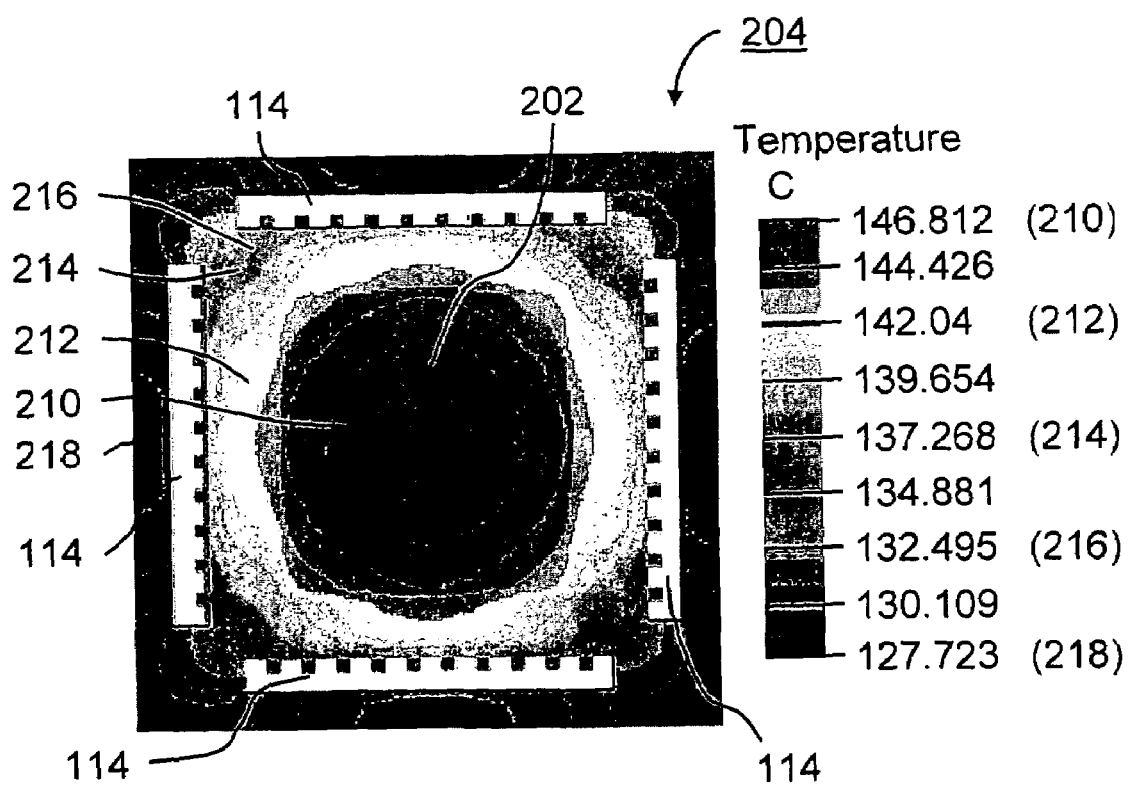
FIG. 2B shows a temperature distribution for a stiffener during operation of an IC device in a flex BGA package.

The use of a stiffener in a flex BGA package requires additional considerations when attempting to manage heat spreading. FIG. 2A shows a top view of a stiffener 112. Stiffener 112 includes an opening 114 adjacent to all four sides of an IC die mounting position 202 in the center of stiffener 112. FIG. 2B shows a temperature distribution 204 of a stiffener, such as stiffener 112, during operation of an IC die in a flex BGA package. Temperature distribution 204 shows that heat transfer from IC die mounting position 202 to the edges of stiffener 112 is substantially limited by openings 114. Openings 114 act as thermal barriers to heat spreading in stiffener 112.

Figure 2C:
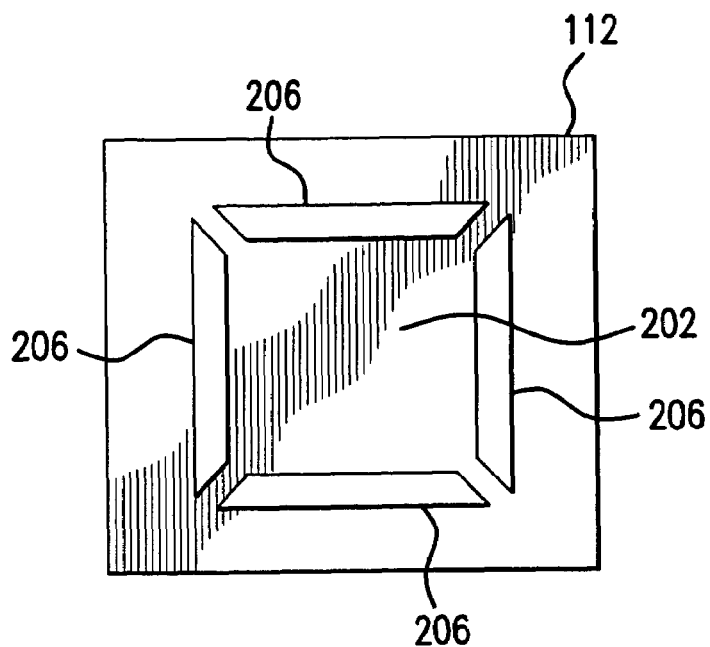
FIG. 2C shows an top view of an alternative stiffener configuration.

FIG. 2C shows a top view of an alternative configuration for stiffener 112, according to an embodiment of the present invention. Stiffener 112 includes an opening 206 adjacent to all four sides of an IC die mounting position 202 in the center of stiffener 112. Openings 206 are similar to openings 114 of FIG. 2A, but have a different shape. The different shape can enhance thermal transfer to the outer areas of stiffener 112, for example. Further alternatively shaped openings in stiffener 112 are applicable to the present invention, including elliptical or rounded openings, etc.

Figure 3:
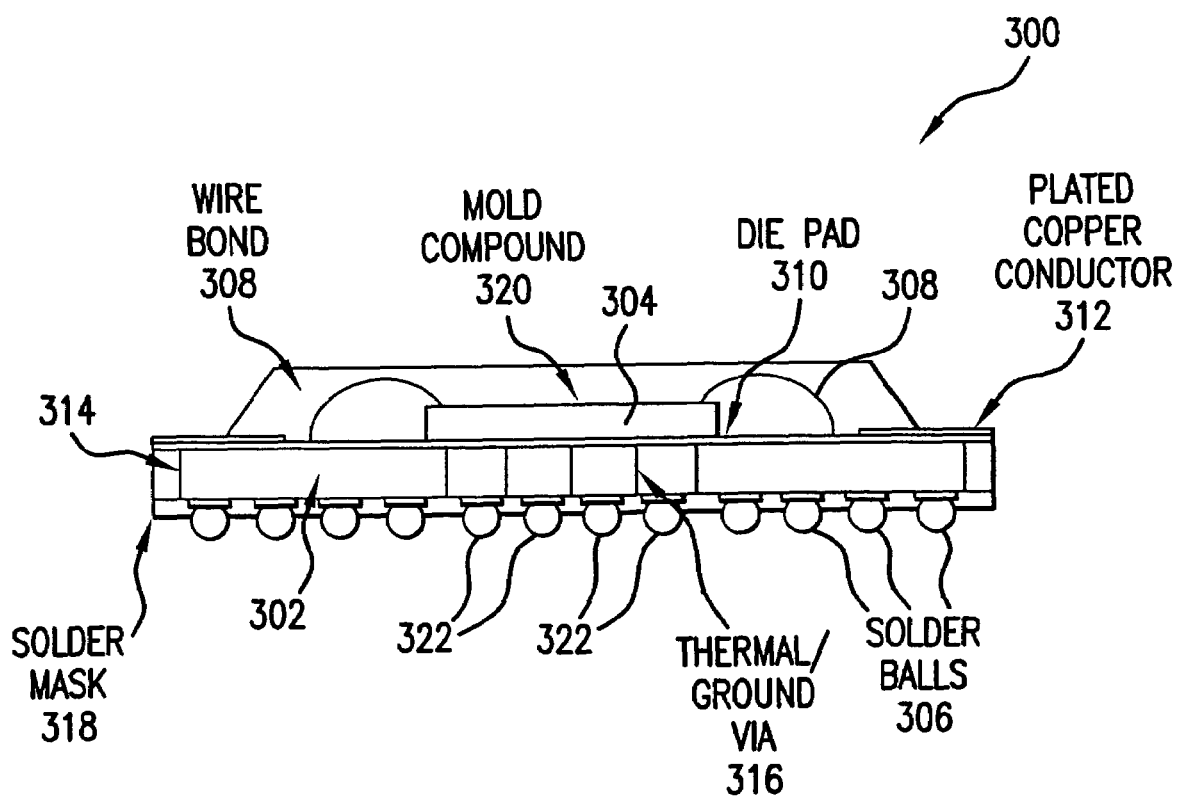
FIG. 3 shows a cross-sectional view of a die-up plastic BGA package.

FIG. 3 shows a cross-sectional view of a conventional die-up PBGA package 300. PBGA package 300 includes a plastic substrate 302, an IC die 304, a plurality of solder balls 306, a plurality of wire bonds 308, a die pad 310, one or more vias 314, and one or more thermal/ground vias 316.

Plastic substrate 302 includes one or more metal layers formed on an organic substrate. For example, plastic or organic substrates may include materials such as "BT", which includes a resin called bis-maleimide triazine, and/or "FR-4," which is a fire-retardant epoxy resin-glass cloth laminate material, and/or other similar materials. IC die 304 is mounted to die pad 310. IC die 304 may be attached to die pad 310 with an epoxy, such as a silver-filled epoxy. Wire bonds 308 connect signals of IC die 304 to substrate 302. For instance, gold bonding wire is bonded from aluminum bond pads on IC die 304 to gold-plated contact pads on substrate 302. The contact pads on substrate 302 connect to solder balls 306 attached to the bottom surface of substrate 302, through vias 314 and routing within substrate 302 using copper conductors 312. Thermal/ground vias 316 connect die pad 310 to one or more thermal/ground balls 322 on the center bottom surface of substrate 302. An encapsulate, mold compound, or epoxy 320 covers IC die 304 and wire bonds 308 for mechanical and environmental protection.

Figure 4A:
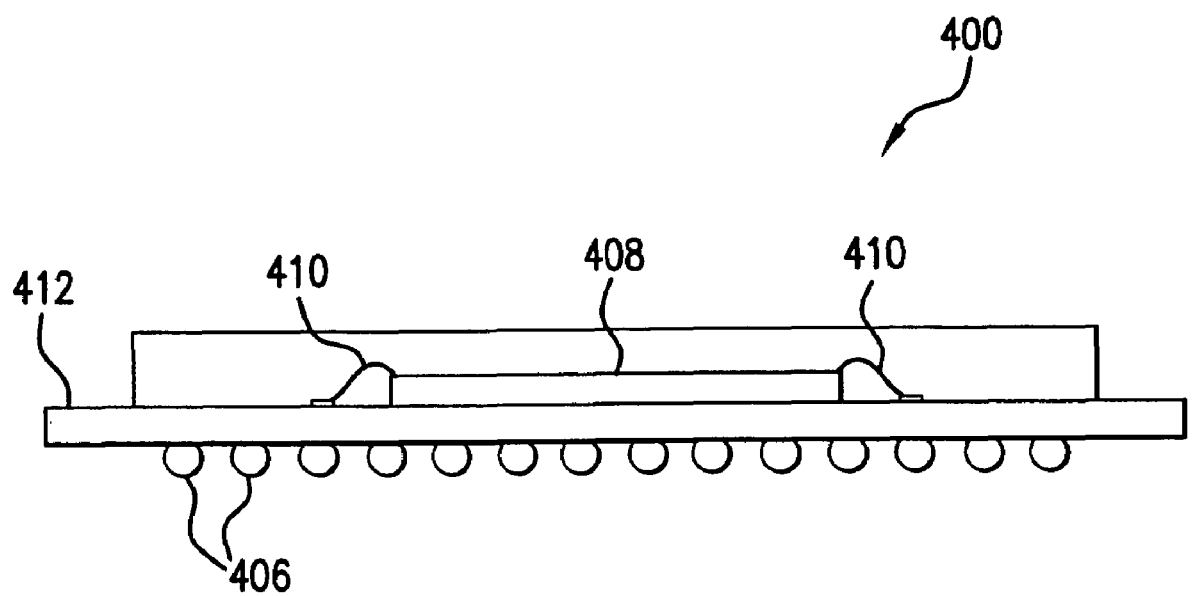
FIG. 4A illustrates a cross-sectional view of a die-up BGA package.
Figure 4B:
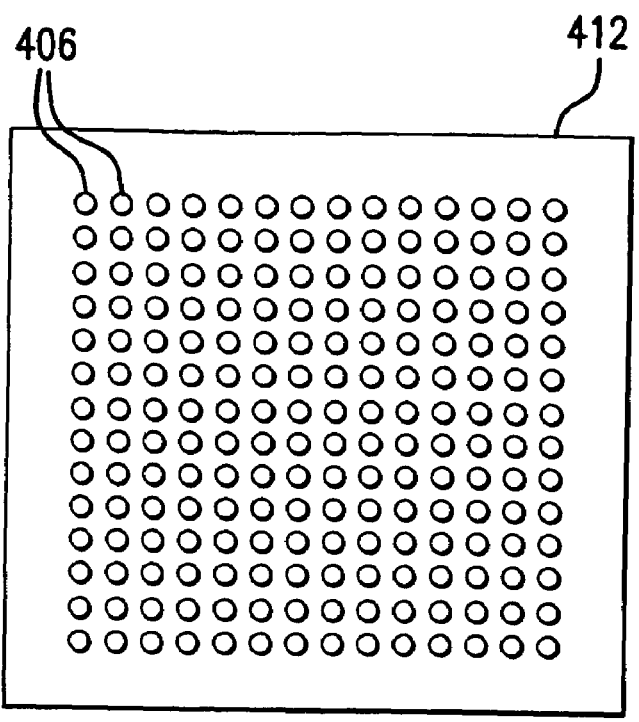
FIGS. 4B and 4C illustrate exemplary solder ball arrangements for the die-up BGA package of FIG. 4A.
Figure 4C:
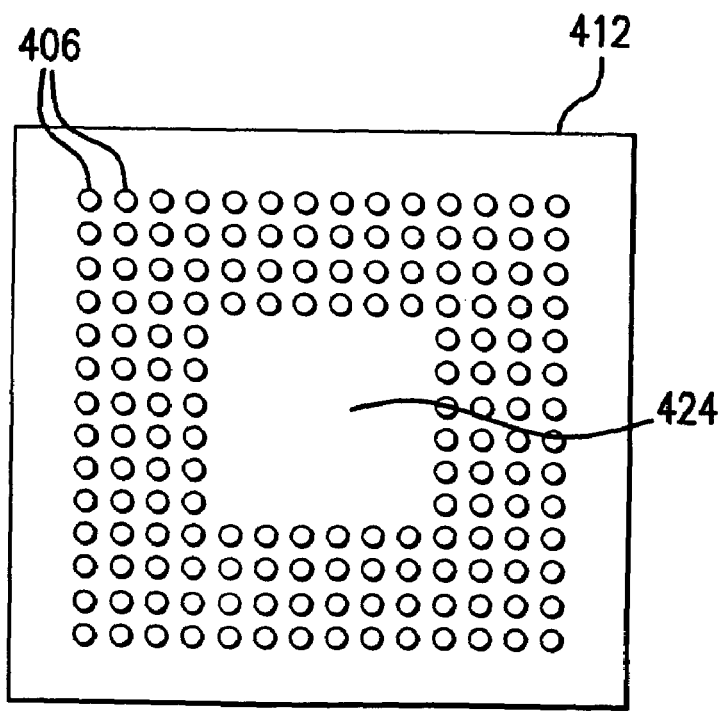

As described above, a BGA package includes an array of solder balls located on a bottom external surface of the package substrate. FIG. 4A illustrates a cross-sectional view of a die-up BGA package 400. FIGS. 4B and 4C illustrate exemplary solder ball arrangements for die-up BGA package 400. As shown in FIG. 4A, BGA package 400 includes an IC die 408 mounted on a substrate 412. IC die 408 is electrically connected to substrate 412 by one or more wire bonds 410. Wire bonds 410 are electrically connected to solder balls 406 underneath substrate 412 through corresponding vias and routing in substrate 412. The vias in substrate 412 can be filled with a conductive material, such as solder, to enhance these connections. Solder balls 406 are attached to substrate 412, and are used to attach the BGA package to a PCB.

Note that although wire bonds, such as wire bonds 410, are shown and described herein, IC dies may be mounted and coupled to a substrate with solder balls located on the bottom surface of the IC die, by a process commonly referred to as "C4" or "flip chip" packaging.

As shown in FIG. 4B, solder balls 406 may be arranged in an array. FIG. 4B shows a 14 by 14 array of solder balls on the bottom surface of BGA package 400. Other sized arrays of solder balls are also applicable to the present invention. Solder balls 406 are reflowed to attach BGA package 400 to a PCB. The PCB may include contact pads to which solder balls 406 are bonded. PCB contact pads are generally made from a metal or combination of metals, such as copper, nickel, tin, and gold.

FIG. 4C shows a bottom view of BGA package 400, with an alternative solder ball array arrangement. BGA package 400 attaches an array of solder balls 406 on a bottom surface of substrate 412. As shown in FIG. 4C, solder balls 406 are located in a peripheral area of the bottom surface of substrate 412, away from a substrate center 424. For example, solder balls 406 on the bottom surface of substrate 412 may be located outside an outer profile area of an IC die mounted on the opposite surface of substrate 412. The solder ball array may be organized in any number of ways, according to the requirements of the particular BGA package application.

The solder ball arrangement shown in FIG. 4C is particularly applicable to embodiments of the present invention described below, such as for attaching a heat spreader/heat sink/heat slug/thermal connector to a bottom surface of a BGA package. The heat spreader/heat sink/heat slug/thermal connector may be connected in substrate center 424, for example.

Figure 5:
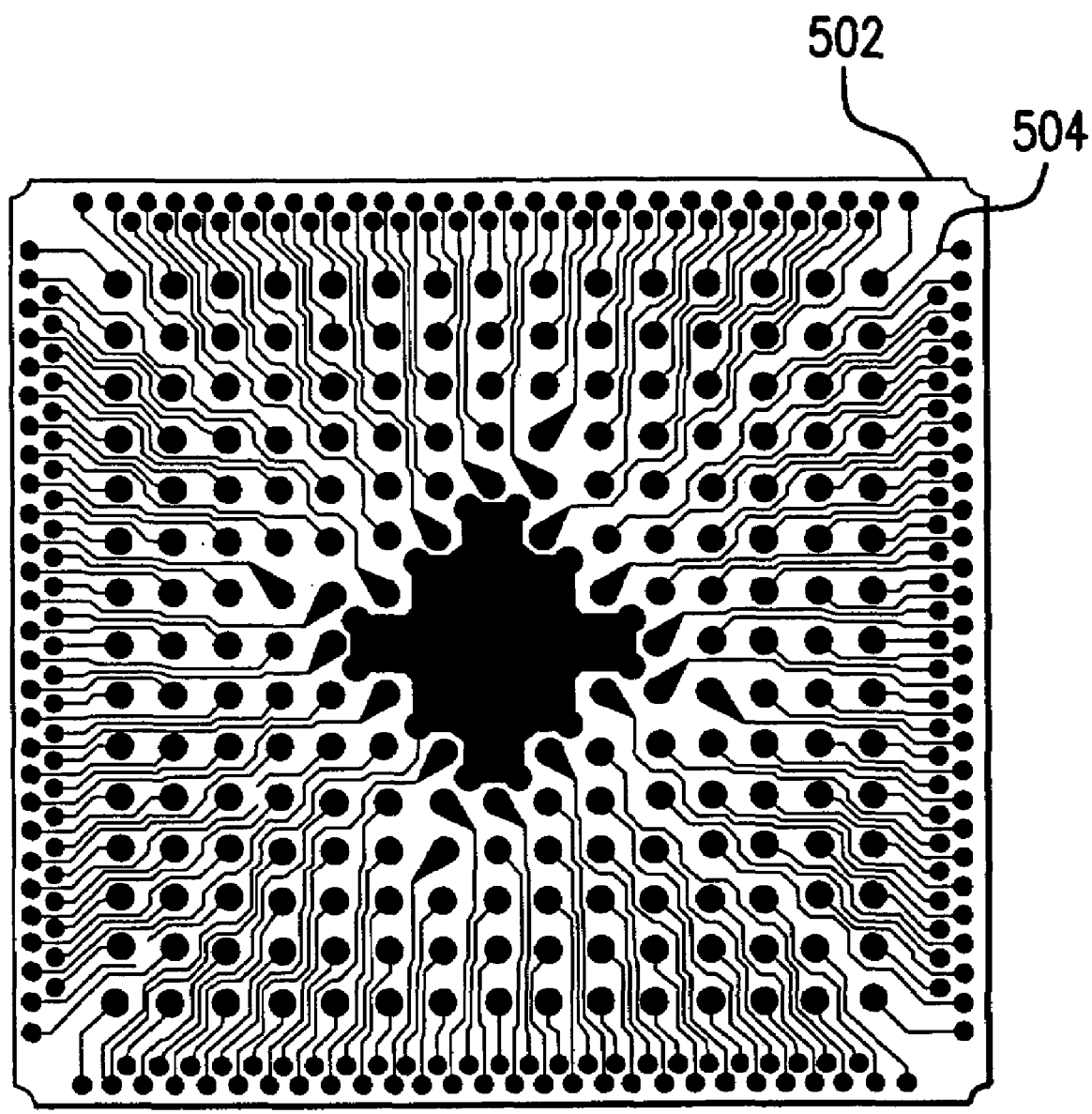
FIG. 5 shows exemplary routing in a substrate layer.

As described above, the BGA package substrate provides electrically conductive vias and routing on one or more electrically conductive layers to connect contact pads for wire bonds on its upper surface to solder balls attached to the bottom substrate surface. For illustrative purposes, FIG. 5 shows solder ball pads and routing 504 in an example bottom substrate layer 502.

The present invention is directed to improving thermal, mechanical, and electrical performance in the BGA package types described herein, and further BGA package types.

Embodiments for Assembling BGA Packages with IC Die Support

According to the embodiments of the present invention, thermal, electrical, and mechanical enhancements to a BGA package are provided, through the introduction of two or more interposers/stiffeners. This section provides example embodiments and description of stiffeners and BGA packages of the present invention. For illustrative purposes, the present invention is described below in the context of the elements of BGA packages 100 and 110 of FIGS. 1A and 1B, but is not limited to these examples. The present invention is applicable to tape and plastic substrate BGA packages, such as BGA packages 100, 110, and 300 described above, to ceramic substrate BGA packages, and to further BGA package types.

FIGS. 6A–6D and 7A–7D show views of example stiffeners, according to embodiments of the present invention. FIGS. 6A–6D show example embodiments for a first stiffener 600, and FIGS. 7A–7D show example embodiments for a second stiffener 700. In embodiments of the present invention, first and second stiffeners 600 and 700 are "stacked" in a BGA package to provide numerous advantages. In further embodiments of the present invention, a third stiffener, and even more stiffeners may be included in a BGA package to provide these advantages. For illustrative purposes, the present invention is described herein in terms of two-stiffener embodiments. However, any number of two or more stiffeners may be included in a BGA package, according to the present invention.

First and second stiffeners 600 and 700 are configured together in a BGA package to provide numerous advantages. First and second stiffeners 600 and 700 are similar to stiffener 112 shown in FIG. 1B, together providing rigidity/stiffness to a BGA package. Furthermore, first and second stiffeners 600 and 700 may provide thermal and/or electrical advantages. In embodiments, first stiffener 600 and/or second stiffener 700 are thermally conductive and provide for heat spreading. In such embodiments, first stiffener 600 and/or second stiffener 700 conduct heat away from an IC die mounted to a central region of first stiffener 600. Hence, first stiffener 600 and/or second stiffener 700 may also be referred to as heat sinks and heat spreaders. In further embodiments, first stiffener 600 and/or second stiffener 700 may be electrically conductive to operate as ground, power, and/or other signal planes. First and second stiffeners 600 and 700 may also be referred to as "interposers."

First and second stiffeners 600 and 700 may have a variety of shapes. For example, as shown in FIGS. 6A and 7A, first and second stiffeners 600 and 700 may be substantially rectangular or square in shape. As shown in FIGS. 6B and 7B, first and second stiffeners 600 and 700 may be substantially rectangular or square in shape, with rounded corners. As shown in FIGS. 6C and 7C, first and second stiffeners 600 and 700 may be substantially elliptical or round in shape. As shown in FIGS. 6D and 7D, first and second stiffeners 600 and 700 may be substantially cross- or "X"-shaped. First and second stiffeners 600 and 700 may have additional shapes, including any polygon, depending on the particular application. By using various shapes for first and second stiffeners 600 and 700, numerous benefits may be achieved, including: (i) enhancement of heat spreading, (ii) an increase in the area available for attachment of one or more wire bonds to a stiffener and/or to the substrate, (iii) a decrease in wire bond lengths, (iv) improvement in the stiffness of the BGA package, and (v) improvement of the overall manufacturability of the BGA package.

Furthermore, as shown in FIGS. 7A–7D, second stiffener 700 has a centrally located opening 702, which is further described below.

According to embodiments of the present invention, stiffeners 600 and 700 can be made from a variety of materials. Stiffeners 600 and 700 can be made from the same materials, or from different materials. For example, stiffeners 600 and 700 can be made from a metal, such as copper, a copper based alloy, aluminum, an aluminum based alloy, as well as other metals and combinations/alloys thereof. Stiffeners 600 and 700 can also be made from ceramic materials, thermally conductive dielectric materials, organic materials, plastics, and combinations of these materials, as would be apparent to persons skilled in the relevant art(s) based on the teachings described herein. In embodiments, stiffener 600 and/or stiffener 700 are made from an electrically conductive material to enhance their electrical properties. Additionally or alternatively, stiffener 600 and/or stiffener 700 may be made from thermally conductive materials to enhance their thermal characteristics.

The surfaces of stiffeners 600 and 700 are not required to be finished. However, one or more surfaces of stiffener 600 and/or stiffener 700 may be finished. For example, surfaces of stiffeners 600 and 700 may be finished using processes such as micro-etch or oxidation (including black oxides, for example) to promote adhesion of an encapsulating material to the stiffeners. In embodiments, a surface plating of a plating material, such as silver, solder, nickel, gold, or other metals and alloys thereof, may be applied to areas of one or more surfaces of stiffener 600 and/or stiffener 700 to create spot, strip, bar, ring, and other shape contact areas. The plating material may be used to enhance attachment of wire bonds to the stiffeners, to enhance attachment of first and second stiffeners 600 and 700 to each other, and to enhance attachment of a heat spreader to the bottom surface of first stiffener 600, as described below.

Figure 8:
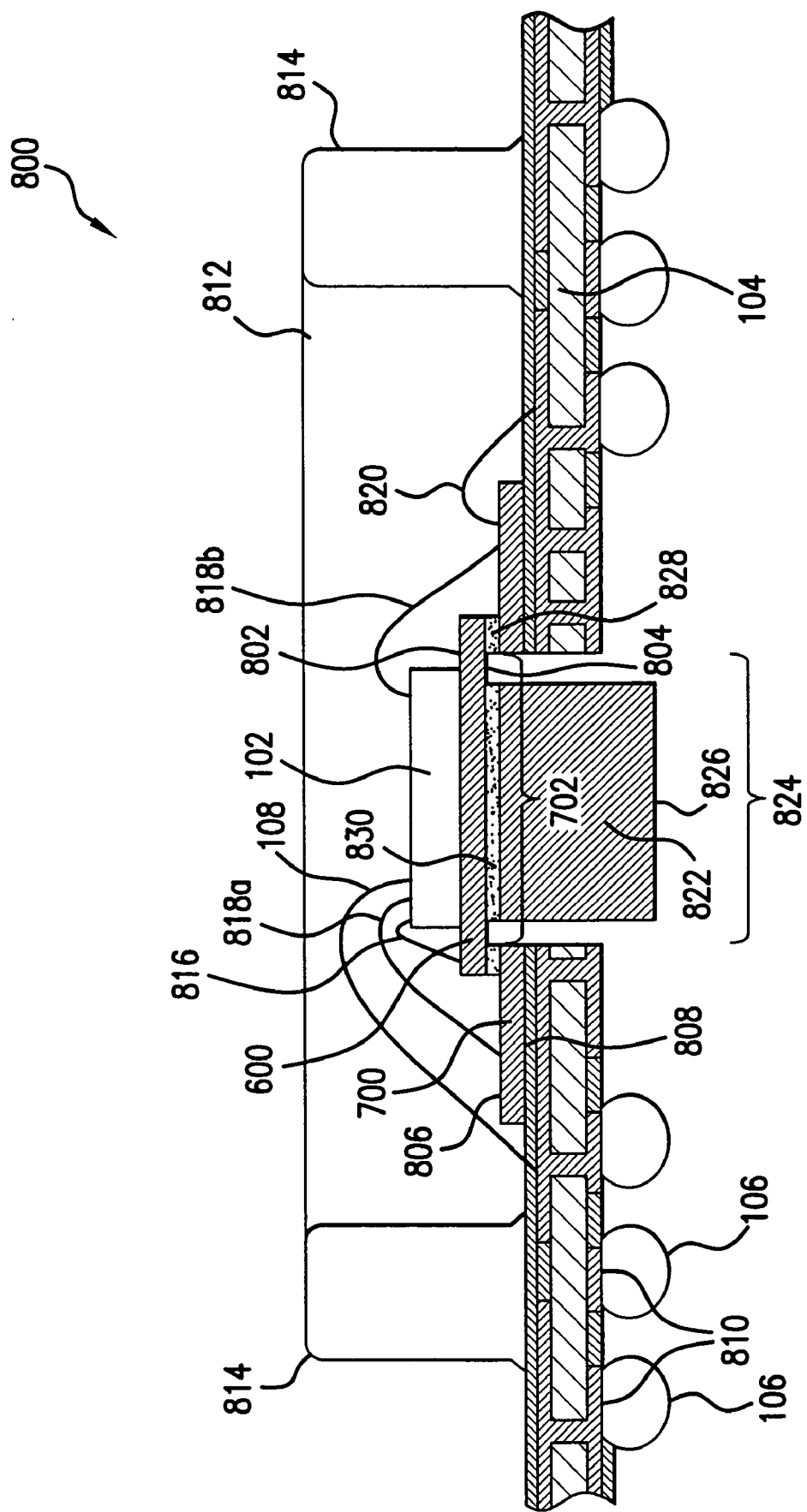

FIG. 8 shows an example BGA package 800 that includes first and second stiffeners 600 and 700, according to an embodiment of the present invention. As shown in FIG. 8, IC die 102 is mounted to a central region of a top surface 802 of first stiffener 600. For example, IC die 102 may be mounted to top surface 802 using an adhesive material. In embodiments, the adhesive material may be a thermally conductive adhesive material, to enhance transfer of heat from IC die 102 to first stiffener 600. For instance, the adhesive material may be an epoxy, such as a silver-filled epoxy, a laminate, a solder, and other adhesive material.

As illustrated in FIG. 8, first stiffener 600 is aligned with an opening 702 in second stiffener 700. A peripheral portion of a bottom surface 804 of first stiffener 600 is then attached to a top surface 806 of second stiffener 700. The attachment of first stiffener 600 to second stiffener 700 covers opening 702 at top surface 806 of second stiffener 700. An adhesive layer 828 formed in a ring around opening 702 attaches the peripheral portion of first stiffener 600 to second stiffener 700. In embodiments, adhesive layer 828 is thermally conductive to enhance heat transfer from first stiffener 600 to second stiffener 700.

In an embodiment, adhesive layer 828 is electrically conductive. In an alternative embodiment, adhesive layer 828 is electrically non-conductive. For example, adhesive layer 828 may be an electrically non-conductive dielectric adhesive material, such as an adhesive tape, film, ceramic, epoxy, plastic, or other electrically non-conductive material. In such an embodiment, because they are electrically isolated, first stiffener 600 and second stiffener 700 may be coupled to different signals, including separate ground, power, and other signals. In this manner, first stiffener 600 and/or second stiffener 700 may operate as isolated power, ground, and other signal planes. Furthermore, such a configuration can promote improved on-chip power delivery, reduce voltage drop, and improve current return. Electrically isolated stiffeners are further described below.

A bottom surface 808 of second stiffener 700 is coupled to a top surface of substrate 104. A plurality of solder ball pads 810 on a bottom surface of substrate 104 have a respective plurality of solder balls 106 attached thereto. Solder ball pads 810 are electrically coupled through substrate 104 to contact pads/lands on the top surface of substrate 104. Conductive areas/lands/fingers/traces/etc. on the top surface of substrate 104 that are wire bond attachable are referred to as "contact pads." Substrate 104 can be tape, organic, ceramic, glass, other dielectric material, and any other substrate type, including those otherwise described herein, for example. For example, organic materials that can be used for substrate 104 include BT, FR-4, and other similar materials. Substrate 104 may have any number of one or more electrically conductive layers for routing. The electrically conductive and dielectric layers of substrate 104 may be constructed through lamination, build-up, and any other substrate construction process.

As shown in FIG. 8, a wire bond 108 is coupled from a bond pad on IC die 102 to a contact pad on the top surface of substrate 104. In embodiments, any number of wire bonds 108 may be used to couple respective bond pads of IC die 102 to contact pads on substrate 104.

Furthermore, in embodiments, one or more wire bonds 816 may be present to couple bond pads on IC die 102 to first stiffener 600. For example, wire bonds 816 may couple from bond pads on IC die 102 that are coupled to power, ground, or other signal internal to IC die 102. Thus, wire bonds 816 couple these signals of IC die 102 to first stiffener 600, which may then operate as a ground, power, or signal plane to enhance electrical performance of BGA package 800. For example, FIG. 8 shows a single a wire bond 816 that couples a bond pad on IC die 102 to top surface 802 of first stiffener 600. The connection area(s) on top surface 802 may be plated with a plating material to enhance the mechanical and electrical connection of wire bond(s) 816 to first stiffener 600. For example, silver, gold, nickel, copper, other metals, and combinations/alloys thereof may be used for the plating material.

Furthermore, one or more wire bonds 818 may additionally or alternatively be present to couple bond pads of IC die 102 to second stiffener 700, similarly to wire bonds 816 described above that couple to first stiffener 600. Hence, second stiffener 700 may additionally or alternatively operate as a ground, power, or signal plane, similarly to first stiffener 600. For example, as shown in FIG. 8, a first wire bond 818*a* is coupled from a first bond pad on IC die 102 to top surface 806 of second stiffener 700, and a second wire bond 818*b* is coupled from a second bond pad on IC die 102 to top surface 806 of second stiffener 700. The connection area(s) on top surface 806 may be plated with a plating material to enhance the mechanical and electrical connection of wire bond(s) 818 to second stiffener 700.

Furthermore, as shown in FIG. 8, one or more wire bonds 820 may additionally or alternatively be present to couple contact pads on substrate 104 to first and/or second stiffeners 600 and 700. For example, the contact pads may connect to signals in substrate 104, such as power, ground, or other signals. Thus, when present, wire bonds 820 couple these signals to one or both of first and second stiffeners 600 and 700, which may each then operate as a ground, power, or signal plane to enhance electrical performance of BGA package 800, similarly to that described above for wire bonds 816 and 818. The connection area(s) on top surface 802 and/or top surface 806 may be plated with a plating material to enhance the mechanical and electrical connection of wire bond(s) 820 to first and/or second stiffeners 600 and 700.

In FIG. 8, an optional heat spreader 822 is attached to bottom surface 804 of first stiffener 600, through opening 702 in second stiffener 700 and an opening 824 in substrate 104. When present, heat spreader 822 may be coupled to a PCB to enhance mechanical attachment of BGA package 800 to the PCB. Heat spreader 822 may be made from a metal, such as copper, aluminum, or other metals and combinations/alloys thereof. Furthermore, heat spreader 822 may be made of other electrically and/or thermally conductive materials.

When present, heat spreader 822 enhances the conduction of heat generated during operation of IC die 102 through first stiffener 600 to the PCB. For example, a bottom surface 826 of heat spreader 822 may be attached to the PCB when BGA package 800 is mounted to the PCB, to transfer heat from heat spreader 822 to the PCB. Hence, heat spreader 822 may also be referred to as a heat sink, a heat slug, and a thermal connector.

Furthermore, heat spreader 822 may be coupled to an electrically conductive area of the PCB to provide an enhanced electrical connection to the PCB for a ground, power, or other signal that is coupled to first stiffener 600.

An adhesive material 830 is used to attach heat spreader 822 to bottom surface 804. In embodiments, adhesive material 830 is an electrically and/or thermally conductive adhesive material to enhance the electrical and thermal connection between heat spreader 822 and first stiffener 600. For example, adhesive material 830 may be an epoxy, such as a silver-filled epoxy, a laminate, a solder, and other adhesive material.

An encapsulate 812 is used to encapsulate IC die 102 and wire bonds on the top surfaces of first and second stiffeners 600 and 700, and substrate 104. For BGA package 800, encapsulate 812 is shown in the form of a "glob top." In a glob top encapsulation embodiment, an encapsulating material is applied in a cavity formed by substrate 104, stiffeners 600 and 700, and a dam 814. Dam 814 may be a material, such as an epoxy, that is formed in a ring to contain the encapsulating material when it is later applied. However, in the embodiments described herein, encapsulate 812 may be any form and type of encapsulation/encapsulating material, including molding compound and epoxy. Other processes can be used for IC die encapsulation, including a single cap over-mold on an entire strip or panel including multiple substrates, and over-mold with multiple caps that expose portions of each substrate. Some examples of various types of encapsulation are further described below.

Figure 9:
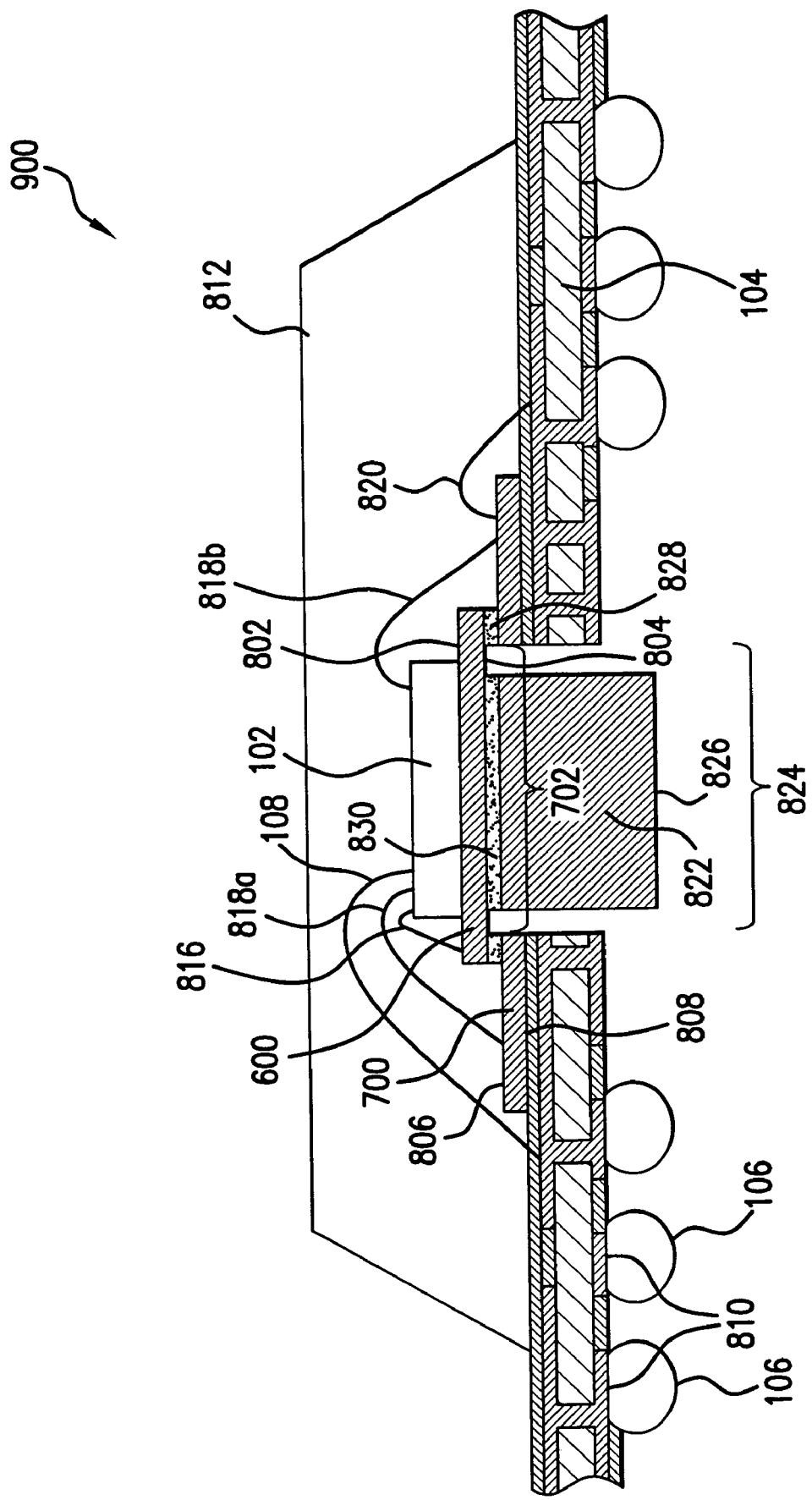

For example, FIG. 9 illustrates a BGA package 900, according to an example embodiment of the present invention. BGA package 900 is similar BGA package 800 shown in FIG. 8, except that encapsulate 812 has been applied to IC die 102 and wire bonds according to an over-mold encapsulation process. During an over-mold encapsulation process, a mold is applied to the top of a BGA package 900, which is filled with an encapsulating material, such as a resin or epoxy. This may be applied to a single BGA package 900, or to a plurality of BGA packages 900 in a panel strip, which are subsequently cut apart to separate the BGA packages 900 in the panel strip. Hence, with encapsulate 812 applied according to a molding process, the outer areas of the top surface of substrate 104 may remain exposed or not covered by encapsulate 812.

Figure 10:
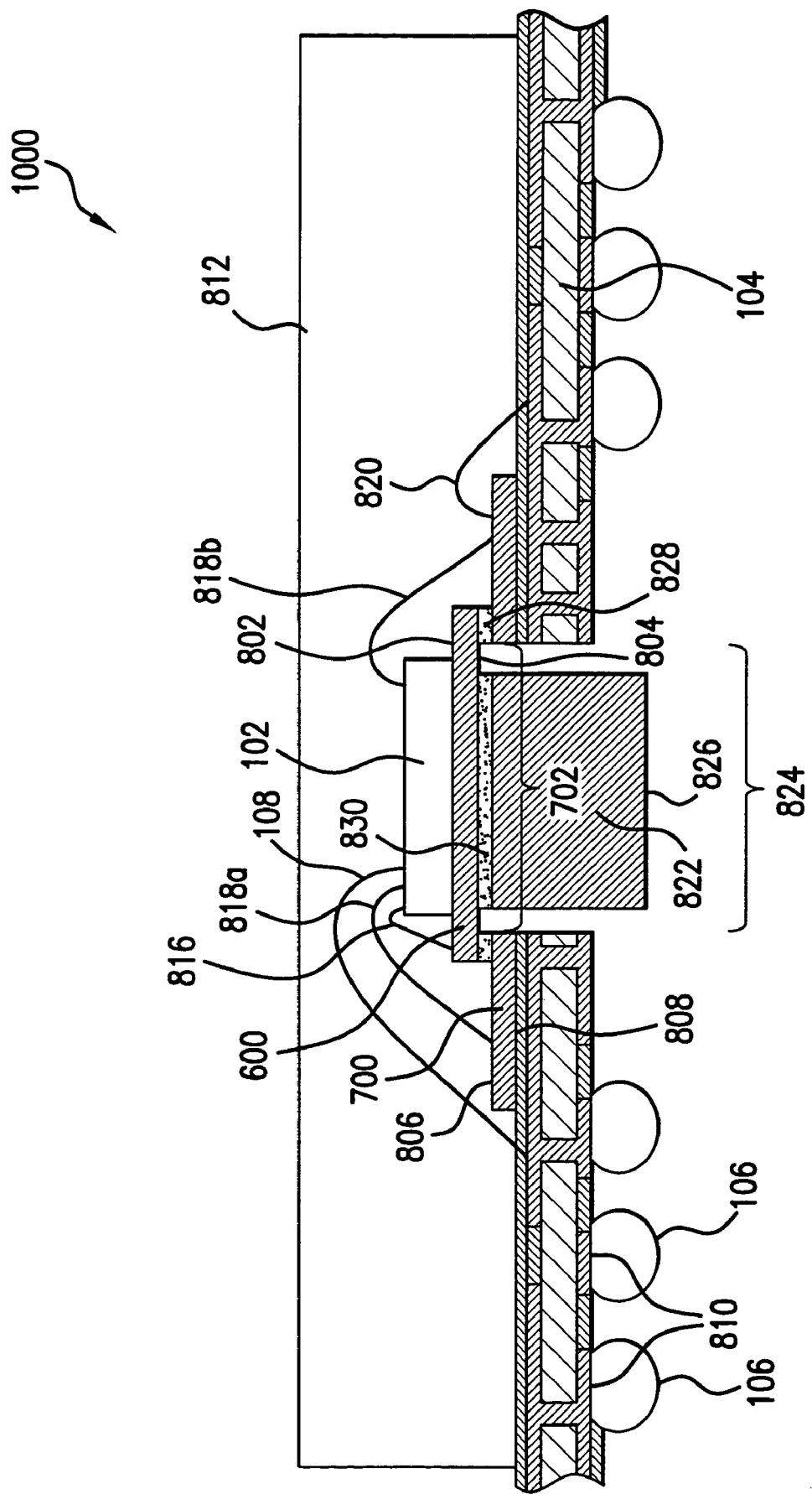

FIG. 10 illustrates a BGA package 1000, according to an example embodiment of the present invention. BGA package 1000 is similar BGA package 800 shown in FIG. 8, except that encapsulate 812 has been applied to the entire top surface of substrate 104. In such an embodiment, a plurality of BGA packages 1000 are formed in a panel strip. The BGA packages 1000 in the panel strip are separated by a saw singulation process. The saw singulation process forms the edges of encapsulate 812, which coincide with the outer edges of substrate 104. Hence, in such an embodiment, the top surface of substrate 104 is typically not exposed outside of encapsulate 812.

FIG. 11A illustrates a BGA package 1100, according to an example embodiment of the present invention. BGA package 1100 is similar to BGA package 1000 shown in FIG. 10, except that the structure of heat spreader 822 is integrated into the structure of first stiffener 600. FIG. 11B shows a perspective view of first stiffener 600 of FIG. 11A. As shown in FIGS. 11A and 11B, first stiffener 600 has a protruding portion 1102 on bottom surface 804. As shown in FIG. 11A, protruding portion 1102 extends through opening 702 in second stiffener 700, and through opening 824 in substrate 104. A bottom surface 1104 of protruding portion 1102 may be attached to a PCB when BGA package 1100 is attached to the PCB, similarly to bottom surface 826 of heat spreader 822 described above and shown in FIGS. 8–10. This embodiment provides improved mechanical, thermal, and electrical, properties for BGA package 1100. A single-piece stiffener/heat spreader requires less parts for BGA package 1100, does not require adhesive layer 830, and is therefore more mechanically sound. Furthermore, a single-piece stiffener/heat spreader provides for improved thermal and/or electrical connectivity.

Second stiffener 700 may have a larger size than described above, and may have one or more additional openings 114 to accommodate wire bonds that connect to the top surface of substrate 104. FIG. 12 shows a view of an example second stiffener 700, according to an embodiment of the present invention. As shown in FIG. 12, second stiffener 700 is similar in size to stiffener 112 shown in FIG. 2A. Second stiffener 700 of FIG. 12 includes centrally located opening 702, and wire bond openings 114a–d.

As shown in FIG. 12, opening 702 is substantially rectangular in shape, with rounded corners. Opening 702 may have any shape, including rectangular, elliptical, other polygons, and combinations thereof, for example.

Furthermore, as shown in FIG. 12, openings 114a–d may have various shapes. Opening 114a is substantially rectangular in shape. Opening 114b is substantially rectangular in shape, with a cutout or notch 1202 formed in an outer edge. Notch 1202 allows for a wire bond 114 to be coupled to substrate 104 at a further distance away from IC die 102. In one aspect, opening 114c may be considered to be a single opening with a stiffener tab or stud 1204 formed across. In another aspect, opening 114c may be considered to be a pair of openings 114 arranged in series along an edge of opening 702. Opening 114d is substantially rectangular in shape, with a cutout or notch 1206 formed in an inner edge. Notch 1206 allows for a wire bond 114 to be coupled to substrate 104 at a closer distance to IC die 102. Openings 114 may have any shape, including rectangular, elliptical, and further polygons and combinations thereof. Furthermore, openings 114 may include notches, studs, steps, and other shapes formed or patterned therein to enhance wire bond connections and for further advantages.

Figure 13:
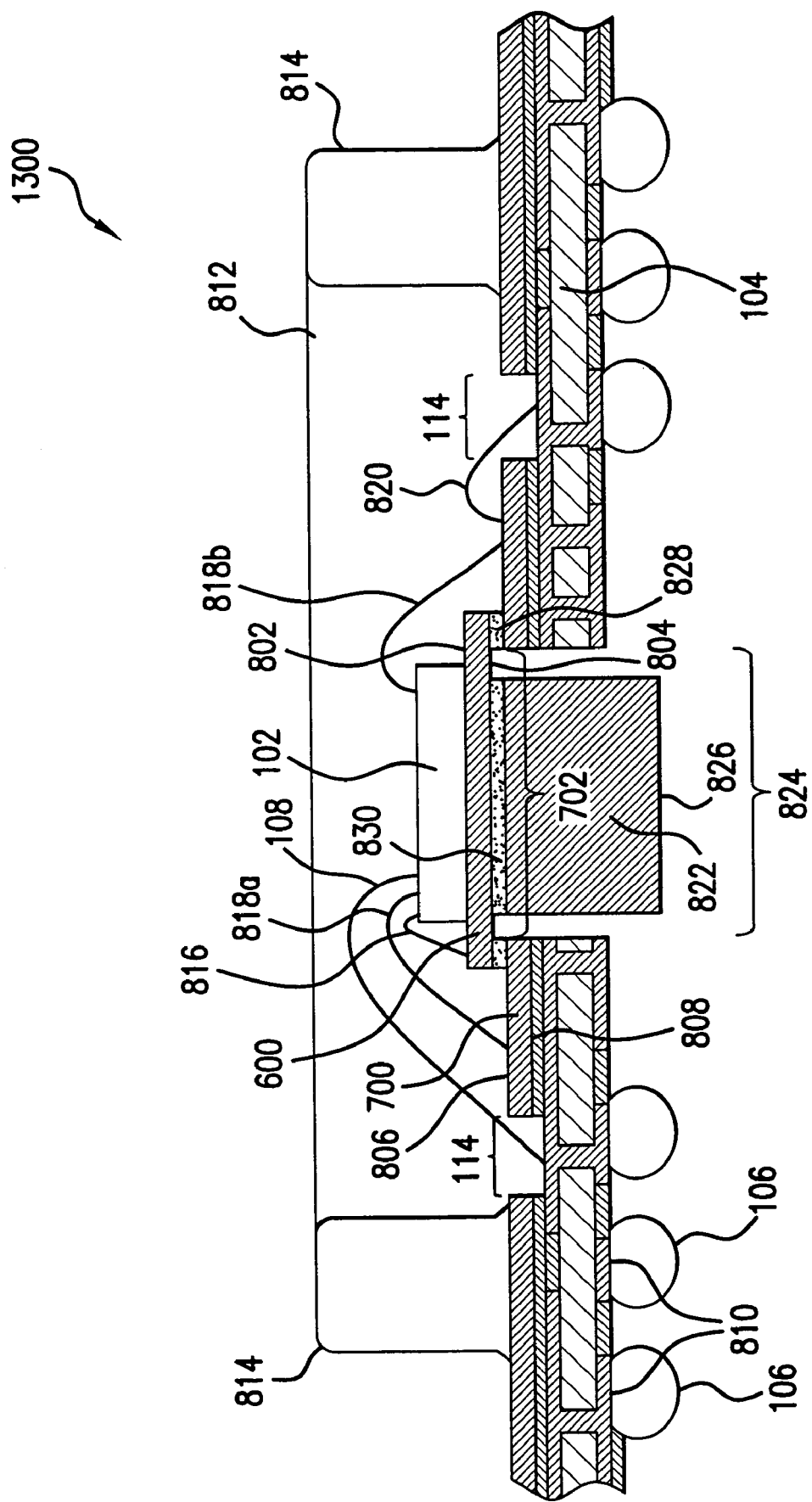

FIG. 13 illustrates a BGA package 1300, according to an embodiment of the present invention. BGA package 1300 is similar BGA package 800 shown in FIG. 8, with the inclusion of second stiffener 700 shown in FIG. 12. As shown in FIG. 13, second stiffener 700 has outer edges that extend to outer edges of substrate 104. This can lead to improved stiffening/rigidity provided by second stiffener 700 to BGA package 1300. One or more wire bond openings 114 through second stiffener 700 allow one or more wire bonds to be connected between bond pads of IC die 102 and contact pads on the top surface of substrate 104. As described above, one or more notches, cutouts, steps, and other shapes may be patterned in the edges of openings 104 to reduce lengths of wire bonds 108 between IC die 102 and substrate 104. The shape or pattern of openings 114 can additionally improve substrate routing, improve manufacturing processes, improve BGA package reliability, and improve additional mechanical, thermal, and electrical performances for BGA package 1300.

Figure 14:
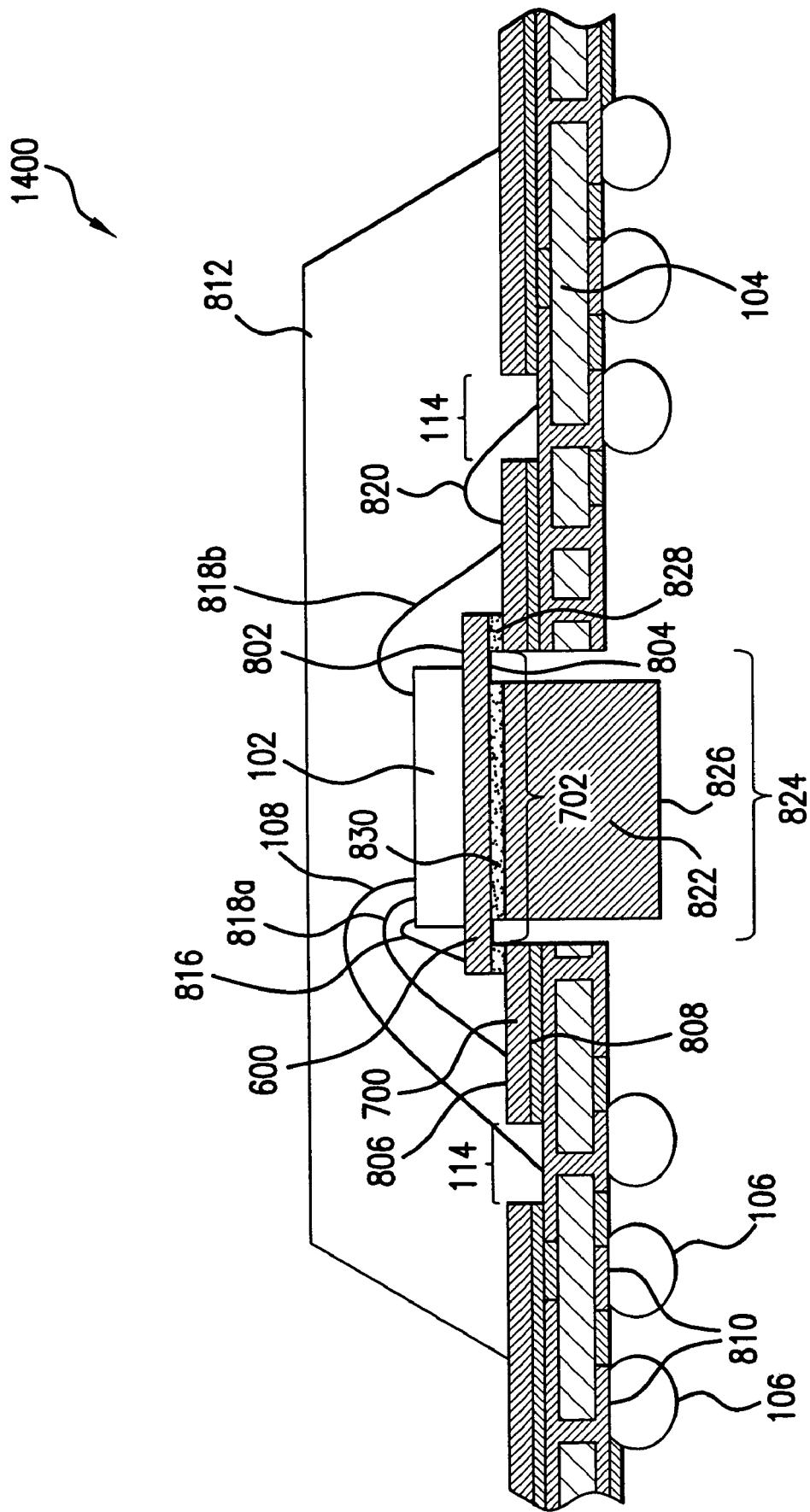

FIG. 14 illustrates a BGA package 1400, according to an example embodiment of the present invention. BGA package 1400 is similar to BGA package 1300 shown in FIG. 13, except that encapsulate 812 has been applied to IC die 102 and wire bonds according to an over-mold process, similar to described above for BGA package 900 shown in FIG. 9.

Figure 15:
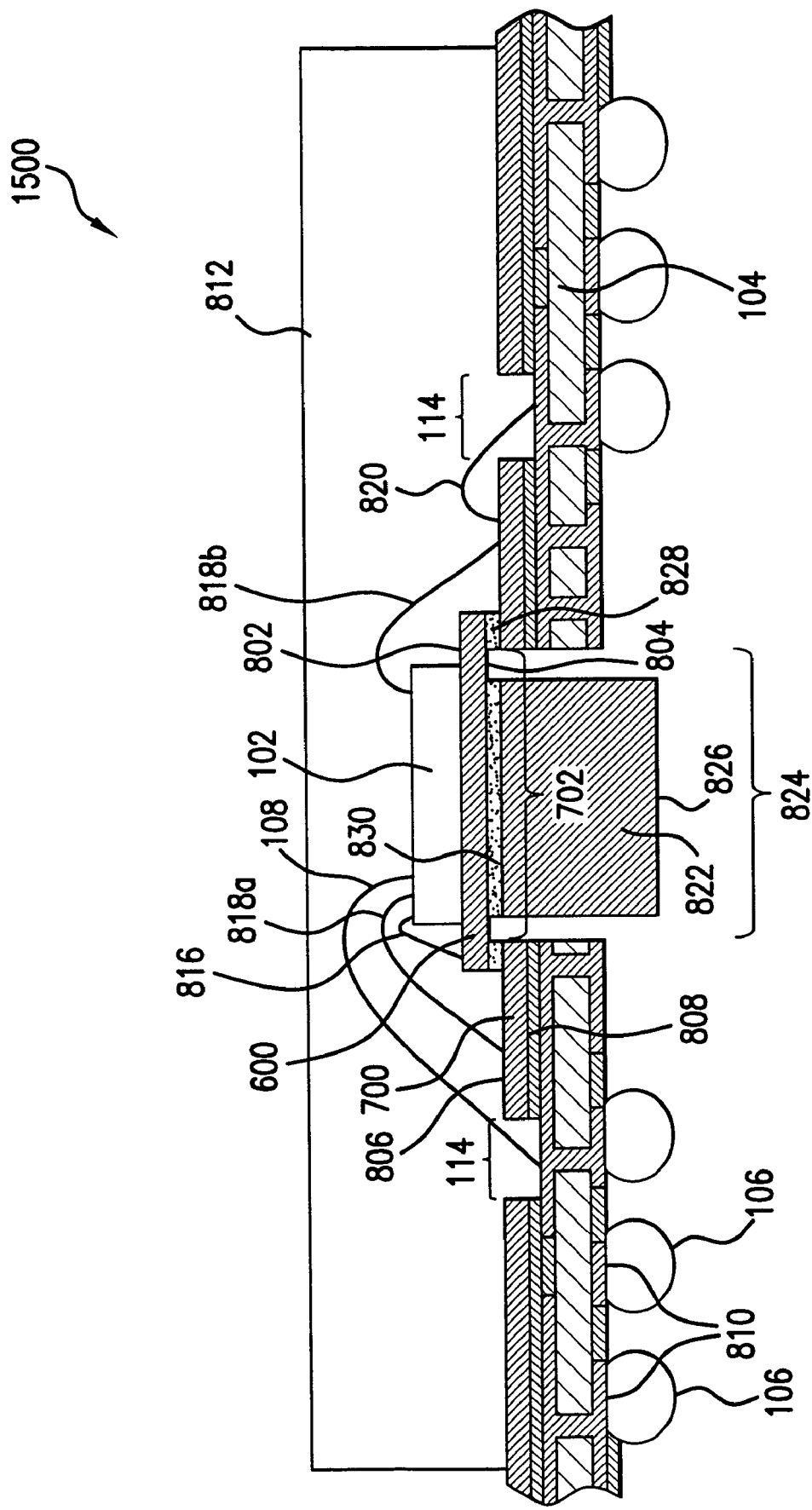

FIG. 15 illustrates a BGA package 1500, according to an example embodiment of the present invention. BGA package 1500 is similar BGA package 1300 shown in FIG. 13, except that encapsulate 812 has been applied to the entire top surface of substrate 104, similar to as described above for BGA package 1000 shown in FIG. 10. Hence, edges of encapsulate 812 are typically formed when BGA package 1500 is separated from a panel, according to a saw singulation technique.

FIG. 18 shows a cross-sectional view of BGA package 1800, according to an embodiment of the present invention. BGA package 1800 is substantially similar to BGA package 1000 shown in FIG. 10, subject to the following discussion. As shown in FIG. 18, a sealant material 1802 fills a gap between heat spreader 822 and substrate 104 in opening 824 and between heat spreader 822 and second stiffener 700 in opening 702. Sealant material 1802 is formed in a ring around heat spreader 822, and therefore is also referred to as a seal ring. In an embodiment, sealant material 1802 is a dielectric sealant, an epoxy, or other electrically non-conductive sealing material. The seal ring formed by sealant material 1802 improves a BGA package resistance to moisture, BGA package manufacturing yields, BGA package reliability, as well as additional BGA package thermal and mechanical performances.

In an alternative embodiment, sealant material 1902 is an electrically conductive material that can electrically couple heat spreader 822 to one or more electrically conductive traces, rings, and/or planes of substrate 104, that are coupled to an electrical potential, and/or to first and/or second stiffeners 600 and 700. Such an embodiment provides additional flexibility for routing of substrate 104, and an improvement in BGA package electrical performance.

The seal ring shown in FIG. 18 is also applicable to other embodiments of the present invention, including those shown in FIGS. 8, 9, 11A, 13–16.

Figure 16:
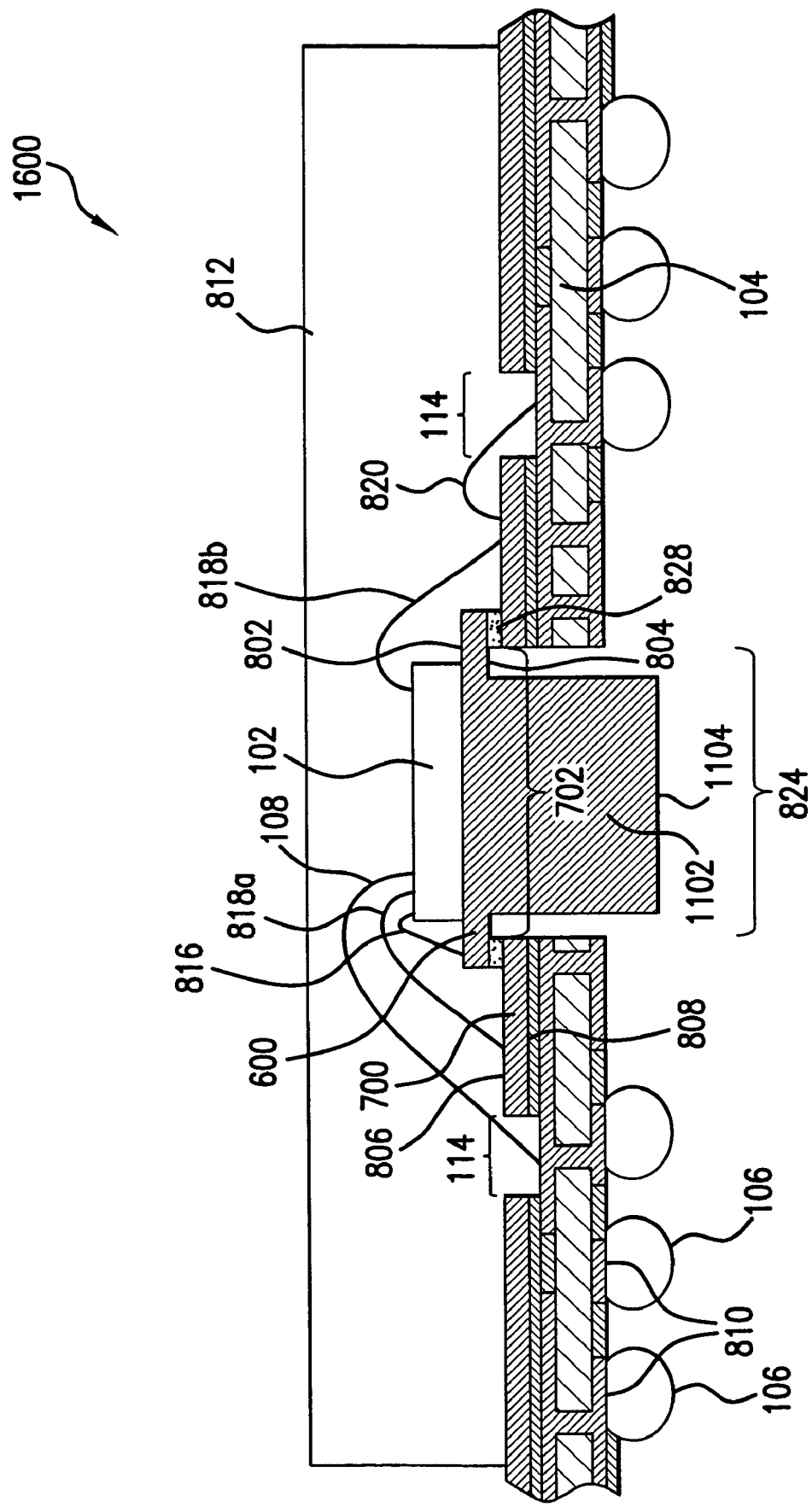

FIG. 16 illustrates a BGA package 1600, according to an example embodiment of the present invention. BGA package 1600 is similar BGA package 1500 shown in FIG. 45, except that heat spreader 822 is integrated into a single-piece structure of first stiffener 600, similar to as described above for BGA package 1100 shown in FIG. 11A.

Note that the embodiments described herein may be combined in any fashion, as would be apparent to persons skilled in the relevant art(s) from the teachings herein.

FIG. 17A shows a flowchart 1700 providing steps for assembling a BGA package according to one or more embodiments of the present invention. FIGS. 17B–17C provide additional optional steps, according to further embodiments of the present invention. The steps of FIGS. 17A–17C do not necessarily have to occur in the order shown, as will be apparent to persons skilled in the relevant art(s) based on the following discussion. Other operational and structural embodiments will be apparent to persons skilled in the relevant art(s) based on the following discussion. These steps are described in detail below.

Flowchart 1700 is shown in FIG. 17A, and begins with step 1702. In step 1702, an IC die is mounted to a first surface of a first stiffener. For example, the IC die is IC die 102, and the first stiffener is first stiffener 600, as shown in FIGS. 8–11B and 13–16. As shown in FIG. 8, for example, IC die 102 is mounted to top surface 802 of first stiffener 600.

In step 1704, a second surface of the first stiffener is attached to a first surface of a second stiffener to cover an opening through the second stiffener. For example, the second stiffener is second stiffener 700, as shown in FIGS. 8–11A and 12–16. As shown in FIG. 8, for example, bottom surface 804 of first stiffener 600 is attached to top surface 806 of second stiffener 700. Opening 702 through second stiffener 700 is covered at top surface 806 by first stiffener 600.

In step 1706, the second surface of the second stiffener is attached to a first surface of a substrate. For example, the substrate is substrate 104, as shown in FIGS. 8–11A and 13–16. As shown in FIG. 8, for example, bottom surface 808 of second stiffener 700 is attached to the top surface of substrate 104.

In an embodiment, flowchart 1700 includes the additional step of step 1708, as shown in FIG. 17B. In step 1708, a heat spreader is attached to the second surface of the first stiffener such that the heat spreader extends through the opening in the second stiffener and through an opening in the substrate that at least partially overlaps with the opening in the second stiffener. For example, the heat spreader is heat spreader 822, as shown in FIGS. 8–10 and 13–15. As shown in FIG. 8, for example, heat spreader 822 is attached to bottom surface 804 of first stiffener 600. Heat spreader 822 extends through opening 702 in second stiffener 700 and through opening 824 in substrate 104. As shown in the examples of FIGS. 8–11A and 13–16, opening 702 and opening 824 are substantially overlapping or coinciding.

In an alternative embodiment, step 1704 includes the step where the second surface of the first stiffener is attached to the first surface of the second stiffener so that a protruding portion of the first stiffener located in a central region of the first surface of the first stiffener extends through the opening in the second stiffener and an opening in the substrate that at least partially overlaps with the opening in the second stiffener. For example, the protruding portion is protruding portion 1102, as shown in FIGS. 11A and 16. Protruding portion 1102 is a portion of first stiffener 600 that is centrally located on bottom surface 804. As shown in FIG. 11A, for example, protruding portion 1102 extends through opening 702 in second stiffener 700 and through opening 824 in substrate 104.

In an embodiment, step 1704 includes the step where the second surface of the first stiffener is attached to the first surface of the second stiffener with an electrically non-conductive adhesive layer. As shown in FIGS. 8–11A and 13–16, first stiffener 600 and second stiffener 700 are attached together by an adhesive layer 828. In embodiments, adhesive layer 828 is electrically non-conductive. In this manner, first stiffener 600 and second stiffener 700 may be coupled to isolated signals or potentials, as described above. In alternative embodiments, adhesive layer 828 is electrically conductive, and hence, first and second stiffeners 600 and 700 may be coupled to a common potential or signal.

In an embodiment, flowchart 1700 includes one or more of the additional steps shown in FIG. 17C. In step 1710, a first bond pad of the IC die is coupled to the first stiffener with a first wire bond. For example, the first wire bond is wire bond 816, as shown in FIGS. 8–11A and 13–16. As shown in FIG. 8, for example, wire bond 816 is coupled between first stiffener 600 and a bond pad of IC die 102.

In step 1712, a second bond pad of the IC die is coupled to the second stiffener with a second wire bond. For example, the second wire bond is one of wire bonds 818a and 818b, as shown in FIGS. 8–11A and 13–16. As shown in FIG. 8, for example, wire bond 818a is coupled between second stiffener 700 and a bond pad of IC die 102.

In step 1714, a bond pad of the IC die is coupled to a first contact pad of a plurality of contact pads on the first surface of the substrate with a wire bond. For example, the wire bond is wire bond 108, as shown in FIGS. 8–11A and 13–16. As shown in FIG. 8, for example, wire bond 108 is coupled between a bond pad of IC die 102 and a contact pad of the top surface of substrate 104.

In an embodiment, step 1714 includes the step where the bond pad is coupled to the first contact pad with a wire bond that extends through a second opening through the second stiffener. For example, the opening is opening 114, as shown in FIGS. 12–16. As shown in FIG. 13, for example, wire bond 108 extends through opening 114.

In step 1716, a plurality of solder balls are attached to a plurality of solder ball pads on a second surface of the substrate. For example, the plurality of solder balls are the plurality of solder balls 106, as shown in FIGS. 8–11A and 13–16, which are shown attached to a plurality of solder ball pads 810.

In step 1718, the IC die is encapsulated with an encapsulating material. For example, the encapsulating material is encapsulate 812, as shown in FIGS. 8–11A and 13–16, which encapsulates IC die 102 on stiffener 700 and/or substrate 104. In an embodiment, encapsulate 812 is a molding compound that is applied to encapsulate IC die 102 and is formed with a mold, as illustrated in FIGS. 9 and 14. In another embodiment, dam 814 is formed to encircle IC die 102, as shown in FIGS. 8 and 13, and encapsulate 812 is applied within dam 814 to encapsulate IC die 102. In still another embodiment, encapsulate 812 is applied to encapsulate IC die 102, as shown in FIGS. 10, 11A, 15, and 16, and edges of the encapsulating material are formed by saw singulation.

Further steps for the processes of flowchart 1700 shown in FIGS. 17A–17C will be known to persons skilled in the relevant art(s) from the teachings herein.

As described above, the present invention is also applicable to having present more than two stiffeners in a BGA package. In such embodiments, for example, the three or more stiffeners may be stacked in a "pyramid" type arrangement. For example, first stiffener 600 may be stacked on a top of the pyramid, on second stiffener 700, such as is shown in FIGS. 8–11A and 13–16. Second stiffener 700 may then be stacked on a third stiffener, which may be stacked on further stiffeners when present. The bottom stiffener of the stiffener pyramid is attached to the top surface of substrate 104. The third and subsequent stiffeners may have an opening therethrough, similar to opening 702 in second stiffener 700, to accommodate a thermal connector, such as heat spreader 822, when present. The third stiffener, and subsequent stiffeners, may each operate as a power, ground, or other signal plane, as described above for first and second stiffeners 600 and 700. Thus, the third stiffener, and subsequent stiffeners, may be formed to be progressively wider so that wire bonds may be attached to peripheral areas of the stiffeners, to couple the stiffeners to the power, ground, and/or other signals. Furthermore, the third stiffener and subsequent stiffeners (when present) can improve rigidity and thermal spreading of the BGA package.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A method of assembling a ball grid array (BGA) package, comprising the steps of:
   (A) mounting an IC die to a first surface of a first stiffener;
   (B) attaching a peripheral portion of a second surface of the first stiffener to a first surface of a second stiffener to cover an opening through the second stiffener that is open at the first surface and a second surface of the second stiffener; and
   (C) attaching the second surface of the second stiffener to a first surface of a substantially planar substrate that has a plurality of contact pads on the first surface of the substrate that are electrically connected through the substrate to a plurality of solder ball pads on a second surface of the substrate.

2. The method of claim 1, further comprising the step of:
   (D) attaching a heat spreader to the second surface of the first stiffener such that the heat spreader extends through the opening in the second stiffener and an opening in the substrate that at least partially overlaps with the opening in the second stiffener.

3. The method of claim 1, wherein step (B) comprises the step of:
   attaching the peripheral portion of the second surface of the first stiffener to the first surface of the second stiffener so that a protruding portion of the first stiffener located in a central region of the first surface of the first stiffener extends through the opening in the second stiffener and an opening in the substrate that at least partially coincides with the opening in the second stiffener.

4. The method of claim 1, wherein step (B) comprises the step of:
   attaching the second surface of the first stiffener to the first surface of the second stiffener with an electrically non-conductive adhesive layer.

5. The method of claim 4, further comprising the steps of:
   (D) coupling a first bond pad of the IC die to the first stiffener with a first wire bond; and
   (E) coupling a second bond pad of the IC die to the second stiffener with a second wire bond.

6. The method of claim 1, further comprising the step of:
   (D) coupling a bond pad of the IC die to a first contact pad of the plurality of contact pads on the first surface of the substrate with a wire bond.

7. The method of claim 6, wherein step (D) comprises the step of:
   coupling the bond pad to the first contact pad with a wire bond that extends through a second opening through the second stiffener.

8. The method of claim 1, further comprising the step of:
   (D) plating at least one area of at least one of the first surface of the first stiffener and the first surface of the second stiffener with an electrically conductive material.

9. The method of claim 8, wherein step (D) comprises the steps of:
   plating a first ring on the first surface of the first stiffener; and
   plating a second ring on the first surface of the second stiffener.

10. The method of claim 9, wherein at least one of the first ring and the second ring comprises a plurality of plated segments.

11. The method of claim 1, further comprising the step of:
    (D) attaching a plurality of solder balls to the plurality of solder ball pads.

12. The method of claim 1, further comprising the step of:
    (D) encapsulating the IC die with an encapsulating material.

13. The method of claim 2, further comprising the step of:
    (E) filling with a sealant material a gap between the heat spreader and the substrate within the opening in the substrate and between the heat spreader and the second stiffener within the opening in the second stiffener.

14. A method of assembling a ball grid array (BGA) package, comprising the steps of:
    (A) mounting an IC die to a first surface of a first stiffener;
    (B) attaching at least one subsequent stiffener between a second surface of the first stiffener and a first surface of a second stiffener to form a stack of stiffeners; and
    (C) attaching a second surface of the second stiffener to a first surface of a substantially planar substrate that has a plurality of contact pads on the first surface of the substrate that are electrically connected through the substrate to a plurality of solder ball pads on a second surface of the substrate.

15. The method of claim 14, wherein step (B) comprises the step of:

attaching the at least one subsequent stiffener between the second surface of the first stiffener and the first surface of the second stiffener with an electrically non-conductive adhesive material.

16. The method of claim 15, wherein the stack of stiffeners has a substantially pyramidal shape, wherein the method further comprises the steps of:

(D) coupling a first bond pad of the IC die to the first surface of the first stiffener with a first wire bond;

(E) coupling at least one bond pad of the IC die to a peripheral surface of the at least one subsequent stiffener with at least one wire bond; and (F) coupling a second bond pad of the IC die to the first surface of the second stiffener with a second wire bond.

17. The method of claim 16, further comprising the step of:

(G) coupling a bond pad of the IC die to a first contact pad of the plurality of contact pads on the first surface of the substrate with a wire bond.

18. The method of claim 17, wherein step (G) comprises the step of:

coupling the bond pad to the first contact pad with a wire bond that extends through an opening in the at least one subsequent stiffener that is open at first and second surfaces of the at least one subsequent stiffener and through an opening in the second stiffener that is open at the first and second surfaces of the second stiffener, wherein the opening in the at least one subsequent stiffener at least partially overlaps with the opening in the second stiffener.

19. The method of claim 14, wherein the second stiffener has an opening that is open at the first and second surfaces of the second stiffener, wherein the at least one subsequent stiffener has an opening that is open at first and second surfaces of the at least one subsequent stiffener and that at least partially overlaps with the opening in the second stiffener, wherein the method further comprises the step of:

(D) attaching a heat spreader to the second surface of the first stiffener such that the heat spreader extends through the opening in the at least one subsequent stiffener, through the opening in the second stiffener, and through an opening in the substrate that at least partially overlaps with the opening in the second stiffener.

20. The method of claim 19, further comprising the step of:

(E) filling with a sealant material a gap between the heat spreader and the substrate within the opening in the substrate, between the heat spreader and the second stiffener within the opening in the second stiffener, and between the heat spreader and the at least one subsequent stiffener within the opening in the at least one subsequent stiffener.

* * * * *